(12) United States Patent
Sakata et al.

(10) Patent No.: US 9,905,529 B2
(45) Date of Patent: Feb. 27, 2018

(54) METHOD FOR MANUFACTURING SEMICONDUCTOR DEVICE

(71) Applicant: RENESAS ELECTRONICS CORPORATION, Tokyo (JP)

(72) Inventors: Kenji Sakata, Tokyo (JP); Tsuyoshi Kida, Tokyo (JP); Yoshihiro Ono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 2 days.

(21) Appl. No.: 15/058,282

(22) Filed: Mar. 2, 2016

(65) Prior Publication Data
US 2016/0260680 A1 Sep. 8, 2016

(30) Foreign Application Priority Data

Mar. 5, 2015 (JP) .................................. 2015-043085

(51) Int. Cl.
| | |
|---|---|
| *H01L 23/48* | (2006.01) |
| *H01L 21/56* | (2006.01) |
| *H01L 23/00* | (2006.01) |
| *H01L 25/065* | (2006.01) |

(52) U.S. Cl.
CPC .............. *H01L 24/81* (2013.01); *H01L 24/16* (2013.01); *H01L 24/27* (2013.01); *H01L 24/75* (2013.01);
(Continued)

(58) Field of Classification Search
CPC ........... H01L 24/81; H01L 2224/81022; H01L 2224/81048; H01L 2224/8121; H01L 2224/81211; H01L 2224/81355; H01L 2224/81375; H01L 2224/81395; H01L 2224/8189–2224/81862; H01L 2224/81895; H01L 24/12–24/17; H01L 24/27; H01L 24/75; H01L 24/92; H01L 24/29; H01L 24/32; H01L 24/83;
(Continued)

(56) References Cited

U.S. PATENT DOCUMENTS

| | | | |
|---|---|---|---|
| 5,208,188 A * | 5/1993 | Newman ............. | H01L 21/4882 156/273.9 |
| 2004/0185602 A1* | 9/2004 | Chaudhuri ............ | H01L 21/563 438/108 |

(Continued)

FOREIGN PATENT DOCUMENTS

JP    2012-231039 A    11/2012

*Primary Examiner* — Marvin Payen
*Assistant Examiner* — Jeremy Joy
(74) *Attorney, Agent, or Firm* — McDermott Will & Emery LLP

(57) ABSTRACT

A method for manufacturing a semiconductor device includes the steps of mounting a Si interposer over a printed wiring substrate, plasma-cleaning an upper surface of the Si interposer, disposing an NCF over the upper surface of the Si interposer, and mounting a semiconductor chip over the upper surface of the Si interposer through the NCF. Also, the method includes the step of electrically coupling each of plural electrodes of a second substrate and each of plural electrode pads of the semiconductor chip with each other through plural bump electrodes by reflow, and the surface of the Si interposer is plasma-cleaned before attaching the NCF to the Si interposer.

13 Claims, 17 Drawing Sheets

(52) U.S. Cl.
CPC .......... *H01L 24/92* (2013.01); *H01L 25/0652*
(2013.01); *H01L 24/13* (2013.01); *H01L 24/29*
(2013.01); *H01L 24/32* (2013.01); *H01L 24/83*
(2013.01); *H01L 2224/1146* (2013.01); *H01L
2224/11849* (2013.01); *H01L 2224/131*
(2013.01); *H01L 2224/13082* (2013.01); *H01L
2224/16238* (2013.01); *H01L 2224/2732*
(2013.01); *H01L 2224/27436* (2013.01); *H01L
2224/73104* (2013.01); *H01L 2224/73204*
(2013.01); *H01L 2224/7565* (2013.01); *H01L
2224/75251* (2013.01); *H01L 2224/75305*
(2013.01); *H01L 2224/75745* (2013.01); *H01L
2224/8121* (2013.01); *H01L 2224/81022*
(2013.01); *H01L 2224/8183* (2013.01); *H01L
2224/81132* (2013.01); *H01L 2224/81191*
(2013.01); *H01L 2224/81203* (2013.01); *H01L
2224/81355* (2013.01); *H01L 2224/81444*
(2013.01); *H01L 2224/81815* (2013.01); *H01L
2224/81862* (2013.01); *H01L 2224/81986*
(2013.01); *H01L 2224/83191* (2013.01); *H01L
2224/83192* (2013.01); *H01L 2224/83862*
(2013.01); *H01L 2224/9205* (2013.01); *H01L
2224/92125* (2013.01); *H01L 2224/97*
(2013.01)

(58) Field of Classification Search
CPC ... H01L 2224/1146; H01L 2224/11849; H01L
2224/131; H01L 2224/27426; H01L
2224/73104; H01L 2224/73204; H01L
2224/801203; H01L 2224/81815; H01L
2224/8183; H01L 2224/83862; H01L
2224/9205; H01L 2224/97
See application file for complete search history.

(56) References Cited

U.S. PATENT DOCUMENTS

| | | | |
|---|---|---|---|
| 2006/0237841 A1* | 10/2006 | Matsumura | H01L 23/49811 257/737 |
| 2007/0108627 A1* | 5/2007 | Kozaka | H01L 23/4985 257/778 |
| 2009/0045507 A1* | 2/2009 | Pendse | H01L 21/563 257/734 |
| 2009/0088527 A1* | 4/2009 | Seo | C08L 21/00 525/187 |
| 2011/0068483 A1* | 3/2011 | Katsurayama | C09D 163/00 257/778 |
| 2014/0134804 A1* | 5/2014 | Kelly | H01L 23/147 438/118 |
| 2014/0226297 A1 | 8/2014 | Kojima | |
| 2014/0231125 A1* | 8/2014 | Chen | H05K 3/281 174/261 |
| 2015/0140738 A1* | 5/2015 | Moriyama | H01L 24/29 438/113 |
| 2015/0179615 A1* | 6/2015 | Watanabe | H01L 24/16 257/737 |

\* cited by examiner

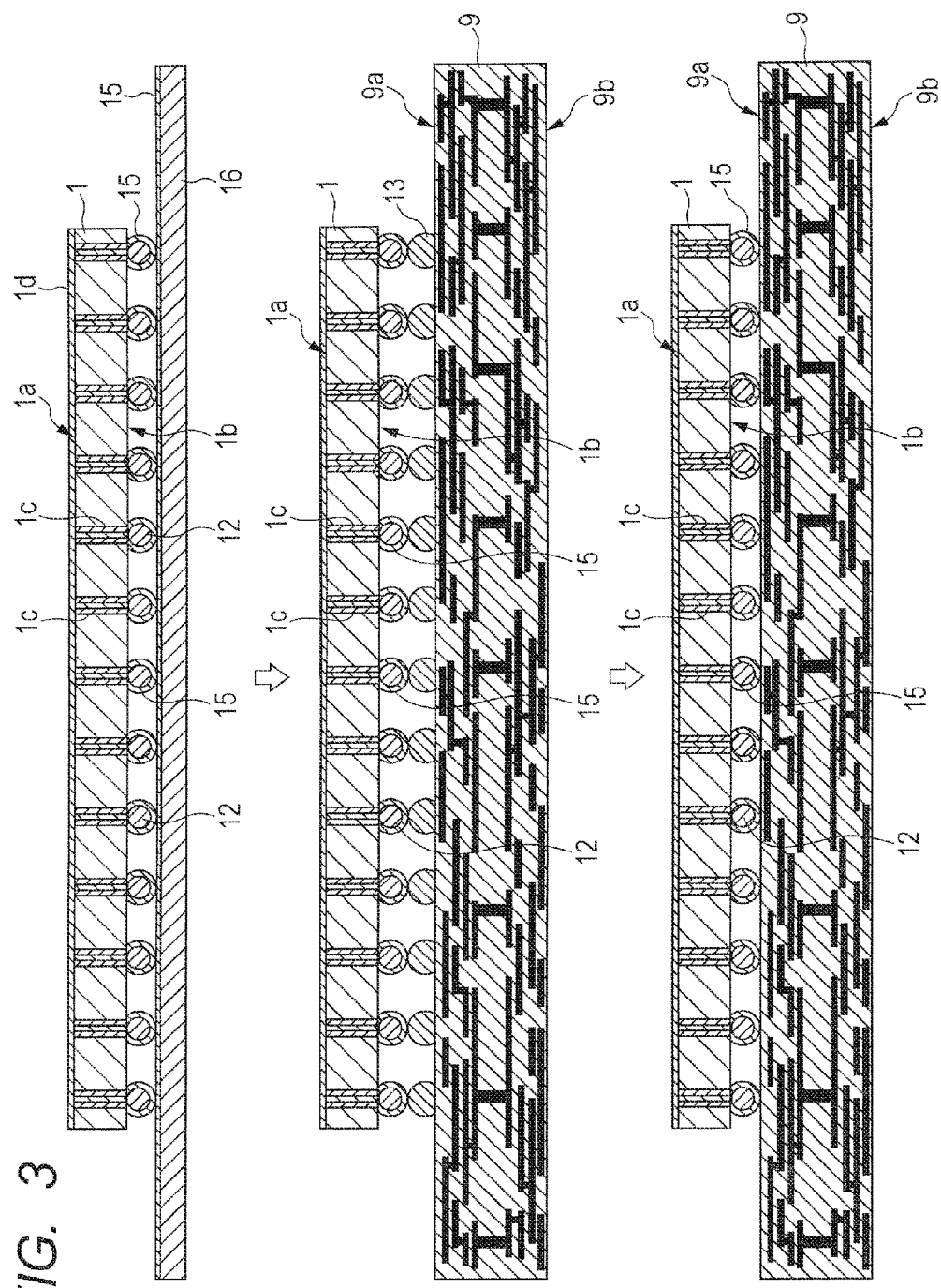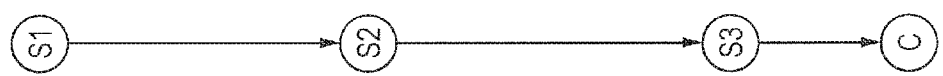

FIG. 5
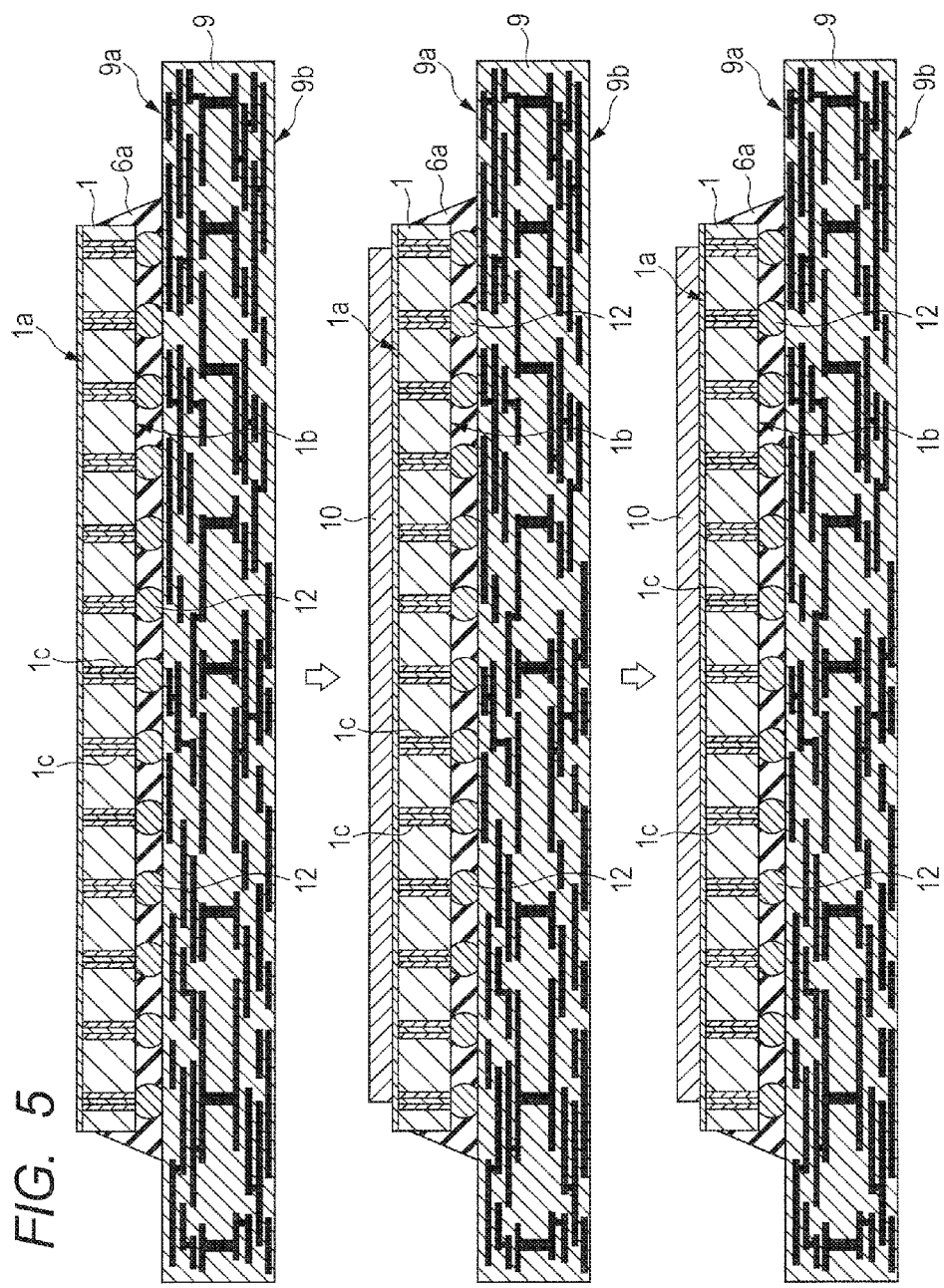
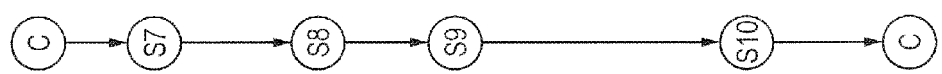

FIG. 7
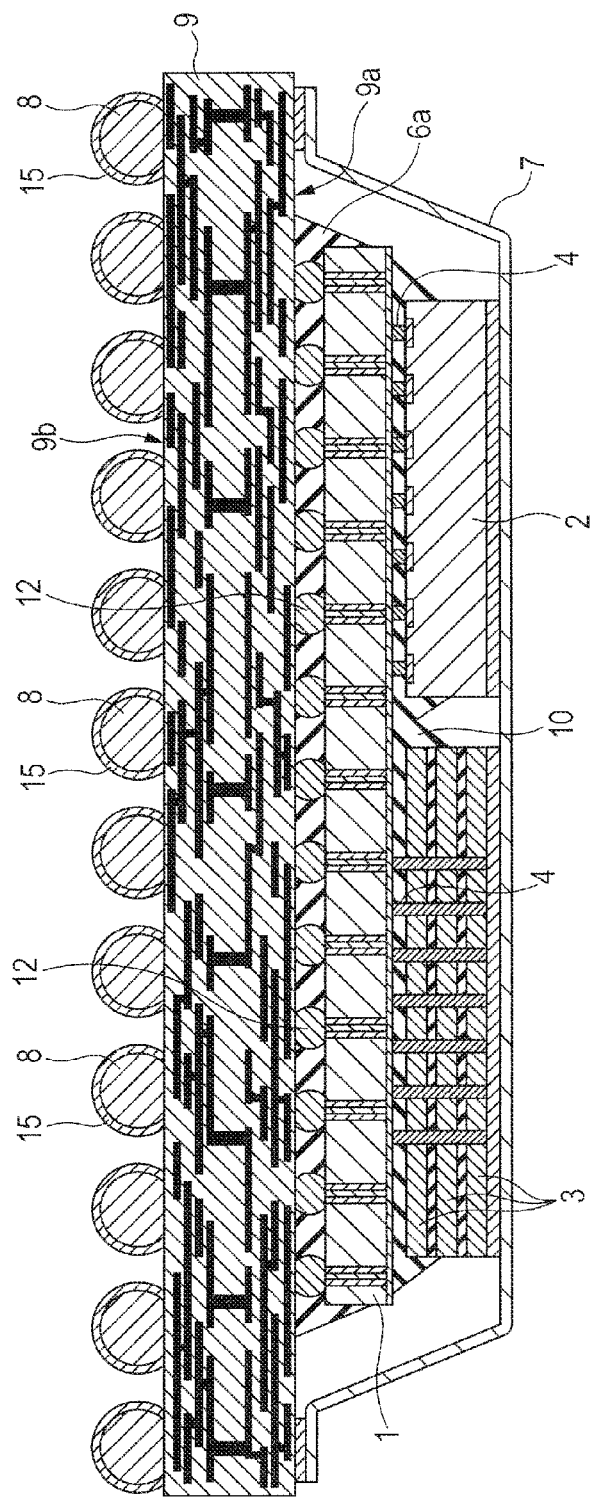
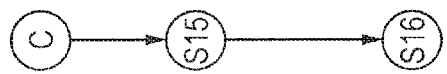

METHOD FOR MANUFACTURING SEMICONDUCTOR DEVICE

CROSS-REFERENCE TO RELATED APPLICATIONS

The disclosure of Japanese Patent Application No. 2015-043085 filed on Mar. 5, 2015 including the specification, drawings and abstract is incorporated herein by reference in its entirety.

BACKGROUND

The present invention relates to a manufacturing technology of a semiconductor device, and relates specifically to a manufacturing technology of a semiconductor device in which flip chip coupling is executed.

In a semiconductor device in which a semiconductor chip is mounted on a substrate by flip chip coupling, a resin (underfill) is disposed in the gap between the semiconductor chip and the substrate, and the coupling section of the flip chip coupling is protected by this resin.

With respect to formation of the underfill described above, there are a prefabrication method in which the resin is fed to over the substrate before the semiconductor chip is mounted, and a retrofitting method in which the resin is poured into the gap described above after the semiconductor chip is mounted. As an example of the prefabrication method, an NCF (Non-Conductive Film) method is known. The NCF is a film-like insulative adhesive, and has the characteristic of having fluidity when heated.

Also, in recent years, the number of pieces of the bump of the semiconductor chip tends to increase because of multi-function and so on of the semiconductor device. As a result, the pitch between the bumps is mostly a fine pitch (narrow pitch). Also, when the pitch between the bumps is the fine pitch, because the bump size also becomes small, the gap between the semiconductor chip and the substrate also becomes narrow, the resin hardly enters the gap even when warp within a permissible range is formed in the substrate for example, and therefore the retrofitting method is not suitable to the fine pitch.

Accordingly, when the pitch between the bumps is made the fine pitch, it is preferable to employ the prefabrication method.

Also, a manufacturing method in which an electronic component is mounted over a wiring board through an adhesive film is disclosed in Japanese Unexamined Patent Application Publication No. 2012-231039, for example.

SUMMARY

In assembling a semiconductor device in which flip chip coupling is executed, when the prefabrication method of the NCF is employed, the adhesiveness between the substrate and the NCF is important. More specifically, when the NCF attaching face of the substrate is stained, the adhesiveness between the substrate and the NCF deteriorates, and the NCF is liable to be peeled off from the substrate. As a result, deterioration of the quality of the semiconductor device and deterioration of the reliability are the problems.

Also, contamination occurs in the baking step and the like, for example. In other words, when the substrate and an organic material such as a resin are subjected to a heat treatment, various chemical substances are emitted and attached to the substrate and the like of the semiconductor device being manufactured, and the stains are generated.

Other problems and new features will be clarified from the description of the present specification and the attached drawings.

A method for manufacturing a semiconductor device according to an embodiment includes the steps of (a) plasma-cleaning an upper surface of a chip support substrate that includes the upper surface where a plurality of electrodes are formed and a lower surface, (b) after the step (a), disposing an insulative adhesive over the upper surface of the chip support substrate, and (c) after the step (b), mounting a semiconductor chip on the upper surface of the chip support substrate through the insulative adhesive. Also, the step of (d) after the step (c), heating the chip support substrate mounted with the semiconductor chip and the insulative adhesive by reflow, and electrically coupling each of the electrodes of the chip support substrate and each of a plurality of electrode pads of the semiconductor chip with each other through a plurality of bump electrodes is included. Further, in the step (d), each of the electrodes and each of the electrode pads are electrically coupled with each other through the bump electrodes in a state the insulative adhesive is disposed around each of the bump electrodes.

Also, another method for manufacturing a semiconductor device according to an embodiment includes the steps of (a) mounting a second substrate over a first substrate with the second substrate including an upper surface where a plurality of electrodes are formed and a lower surface, (b) after the step (a), baking the first substrate, and (c) after the step (b), plasma-cleaning the upper surface of the second substrate. Further, the steps of (d) after the step (c), disposing an insulative adhesive over the upper surface of the second substrate, and (e) after the step (d), mounting a semiconductor chip over the upper surface of the second substrate through the insulative adhesive are included. Furthermore, the step of (f) after the step (e), heating the second substrate mounted with the semiconductor chip and the insulative adhesive by reflow, and electrically coupling each of the electrodes of the second substrate and each of a plurality of electrode pads of the semiconductor chip with each other through a plurality of bump electrodes is included. Also, in the step (f), each of the electrodes and each of the electrode pads are electrically coupled with each other through the bump electrodes in a state the insulative adhesive is disposed around each of the bump electrodes.

According to the embodiments described above, the reliability of the semiconductor device can be improved.

BRIEF DESCRIPTION OF THE DRAWINGS

FIG. 3 is a cross-sectional view showing a structure in a part of the steps of the assembling procedure shown in FIG. 2.

FIG. 5 is a cross-sectional view showing a structure in a part of the steps of the assembling procedure shown in FIG. 2.

FIG. 7 is a cross-sectional view showing a structure in a part of the steps of the assembling procedure shown in FIG. 2.

DETAILED DESCRIPTION

Figure 1:
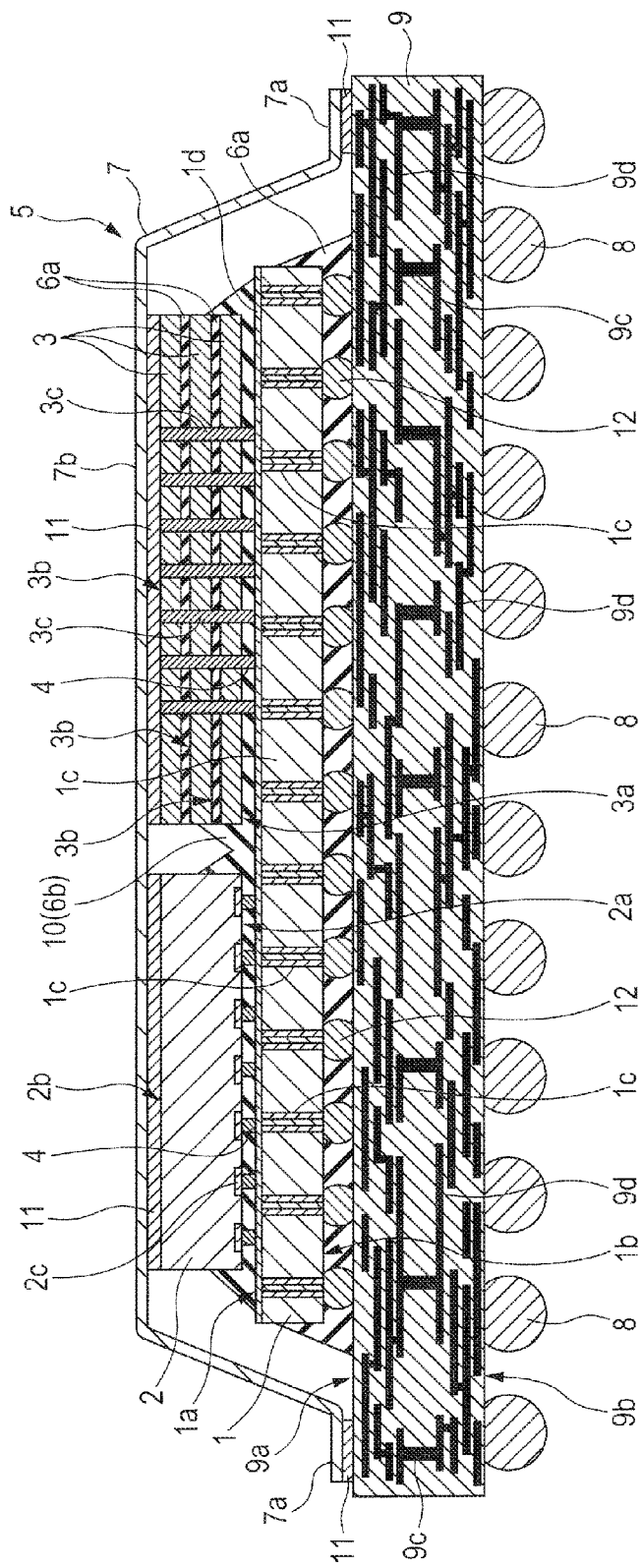
FIG. 1 is a cross-sectional view showing an example of a structure of a semiconductor device of an embodiment.

In the embodiments below, explanation on a same or similar portions will not be repeated in principle except when it is particularly required.

Also, in the embodiments below, when it is required for the sake of convenience, although description will be made divided into plural sections or embodiments, they are not unrelated to each other, and one has a relationship of a modification, detail, supplementary explanation and the like of a part or entirety with the other with the exception of a case particularly stated explicitly.

Further, in the embodiments below, when the quantity of elements and the like (including the number of pieces, numerical value, amount, range and the like) are mentioned, they are not limited to the specific quantity and may be equal to or more than and equal to or less than the specific quantity with the exception of a case particularly specified explicitly, a case apparently limited to a specific quantity in principle, and so one Further, in the embodiments below, it is needless to mention that the constituent elements thereof (also including the elemental step and the like) are not necessarily indispensable with the exception of a case particularly specified explicitly, a case considered to be apparently indispensable in principle, and so on.

Also, in the embodiments below, it is needless to mention that, when it is mentioned "is formed of A", "is composed of", "includes A", and "comprises A" with respect to a constituent element and the like, with the exception of a case explicitly stated particularly to be the element only and so on, an element other than said element is not to be excluded. In a similar manner, in the embodiments below, when the shape, the positional relation and the like of a constituent element and the like are mentioned, they are to contain one that is substantially approximate or similar to the shape and the like thereof and so on with the exception of a case particularly specified explicitly, a case apparently considered not to be the case in principle, and so on. This fact also applies to the numerical value and the range described above.

Below, the embodiment of the present invention will be explained in detail based on the drawings. Also, in all drawings for explaining the embodiment, a same reference sign will be given to a member having a same function, and repeated explanation thereon will be omitted. Further, there is a case hatching is given even in a plan view in order to facilitate understanding of the drawing.

(Embodiment)

FIG. 1 is a cross-sectional view showing an example of a structure of a semiconductor device of the embodiment.

The semiconductor device of the present embodiment shown in FIG. 1 is a semiconductor package in which a logic chip 2 and memory chips 3 are mounted over an interposer that electrically couples a main substrate and a semiconductor chip with each other, and the logic chip 2 and the memory chip 3 are flip-chip-coupled respectively over the interposer. Also, the memory chip 3 may be mounted by one stage (one piece) only, or may be laminated over plural stages. The structure shown in FIG. 1 shows a case the memory chips 3 are laminated by 3 stages.

Also, in the present embodiment, as an example of the semiconductor device described above, a case in which the terminals for external coupling of the semiconductor device described above are plural ball electrodes arranged over the lower surface of the main substrate will be explained. Therefore, the semiconductor device explained in the present embodiment is also a semiconductor package of a BGA (Ball Grid Array) type (hereinafter referred to simply as BGA 5).

Also, in the BGA 5 of the present embodiment, over each of the logic chip 2 and the memory chips 3, a radiator plate called a lid 7 is arranged so as to cover these semiconductor chips.

Further, an interposer is a chip support substrate that relays the semiconductor chip and a main substrate (first substrate) to each other whose terminal pitch is different from each other, and the interposer of the present embodiment is a substrate formed of Si (silicon). In the present embodiment, this chip support substrate is hereinafter called a Si interposer (second substrate) 1.

Here, the wiring that couples the logic chip 2 and the memory chips 3 with each other is completed within the Si interposer 1, and therefore the Si interposer 1 has also a function of being capable of reducing the number of pieces of the terminals coupled to the main substrate and expanding the terminal pitch as a result.

Also, in the BGA 5, plural bump electrodes arranged in the logic chip 2 and the memory chips 3 are arranged with a fine pitch (narrow pitch). Therefore, each of the bump electrodes that are in a plurality so as to correspond to the fine pitch is a Cu pillar (columnar electrode) 4 formed of an alloy with the main composition of Cu (copper). The Cu pillar 4 is also called a micro-bump, for example.

The detailed structure of the BGA 5 shown in FIG. 1 will be explained. The BGA 5 includes a printed wiring substrate (first substrate) 9 that is a main substrate, the Si interposer (chip support substrate, second substrate) 1 that is a relay substrate mounted over the upper surface 9a of the printed wiring substrate 9 through plural solder balls 12, and the logic chip 2 and the memory chips 3 flip-chip-coupled respectively with the upper surface 1a of the Si interposer 1.

Therefore, the upper surface 9a of the printed wiring substrate 9 and the lower surface 1b of the Si interposer 1 are disposed so as to oppose each other across the plural solder balls 12, and the upper surface 1a of the Si interposer 1 and the main surface 2a of the logic chip 2 and the main surface 3a of the memory chip 3 are disposed so as to oppose each other across the plural Cu pillars 4, respectively.

As described above, the logic chip 2 is flip-chip-coupled with the upper surface 1a of the Si interposer 1 through the plural Cu pillars 4 that are arranged with a fine pitch, whereas the memory chips 3 are also flip-chip-coupled with the upper surface 1a of the Si interposer 1 through the plural Cu pillars 4 that are arranged with a fine pitch in a similar manner.

Also, the memory chips 3 are laminated by 3 stages, and each is electrically coupled with the plural Cu pillars 4 through penetration via 3c. In other words, the memory chip 3 of the second stage is laminated over the rear surface 3b of the memory chip 3 of the first stage, and the memory chip 3 of the third stage is laminated over the rear surface 3b of the memory chip 3 of the second stage.

Also, in the surface layer on the upper surface 1a side of the Si interposer 1, a wiring layer 1d is formed, and in the inside, plural penetration vias 1c that extend from the upper surface 1a side to the lower surface 1b side are arranged. By them, each of the plural Cu pillars 4 and each of the plural solder balls 12 arranged on the lower surface 1b side are electrically coupled with each other through the wiring formed in the wiring layer 1d and the penetration via 1c. In a similar manner, the plural Cu pillars 4 of the memory chips 3 are also electrically coupled with each of the plural solder balls 12 arranged on the lower surface 1b side through the wiring formed in the wiring layer 1d and the penetration via 1c.

Also, the printed wiring substrate 9 includes plural internal wirings 9d and plural vias 9c, and plural BGA balls 8 are arranged over the lower surface 9b thereof. These BGA balls 8 are terminals for external coupling or external electrode terminals of the BGA 5.

By the configurations described above, electrode pads 2c of the main surface 2a of the logic chip 2 are electrically coupled with the BGA balls 8 on the lower surface 9b side of the printed wiring substrate 9 through the Cu pillars 4, the penetration vias 1c of the Si interposer 1, the solder balls 12, and the internal wirings 9d and the vias 9c of the printed wiring substrate 9. On the other hand, in a similar manner, the penetration vias 3c of the memory chips 3 are electrically coupled with the BOA balls 8 on the lower surface 9b side of the printed wiring substrate 9 through the Cu pillars 4, the penetration vias 1c of the Si interposer 1, the solder balls 12, and the internal wirings 9d and the vias 9c of the printed wiring substrate 9.

Also, between the printed wiring substrate 9 and the Si interposer 1, an underfill (resin) 6a is filled. This underfill 6a of the Si interposer 1 is poured and disposed after the Si interposer 1 is flip-chip-coupled onto the printed wiring substrate 9 through the plural solder balls 12.

On the other hand, an underfill (resin) 6b of each of the logic chip 2 and the memory chips 3 is an NCF (insulative adhesive) 10, the NCF 10 is disposed over the upper surface 1a of the Si interposer 1 before each of the logic chip 2 and the memory chips 3 is flip-chip-coupled, and the logic chip 2 and the memory chips 3 are mounted from the top of the NCF 10 after the disposal. In other words, the NCF 10 that is the underfill 6b of each of the logic chip 2 and the memory chips 3 is disposed over the Si interposer 1 by a prefabrication (also called pre-coating) method.

However, in the gap between the memory chip 3 of the first stage and the memory chip 3 and the gap between the memory chip 3 of the second stage and the memory chip 3 of the third stage of the second stage out of the memory chips 3 laminated by 3 stages, the underfills 6a that are the resins poured into the each gap are disposed. These underfills 6a are poured into the gaps between the respective chips after all of the memory chips 3 are laminated.

Also, in the BGA 5, a lid 7 is arranged as a radiator plate. The lid 7 is arranged so as to cover the logic chip 2, three memory chips 3, and the Si interposer 1. The lid 7 includes edge sections 7a and a ceiling section 7b that is positioned higher than the edge sections 7a, and the edge sections 7a are joined to the peripheral part of the upper surface 9a of the printed wiring substrate 9 by adhesives 11. Thus, the logic chip 2, the memory chips 3, and the Si interposer 1 are covered and protected by the lid 7.

Also, the ceiling section 7b of the lid 7 is joined with the rear surface 2b of the logic chip 2 and the rear surface 3b of the memory chip 3 of the third stage respectively through the adhesives 11, and the heat generated from the logic chip 2 and the memory chips 3 is transferred to the lid 7 and is emitted to the outside. In other words, the lid 7 has also the function of a radiator plate.

Therefore, when the radiation property is considered, the adhesive 11 is preferable to use an electro-conductive adhesive (electro-conductive resin), and is a silver paste, an aluminum-based paste, and the like, for example.

Also, the memory chip 3 mounted on the BGA 5 is a DRAM (Dynamic Random Access Memory), for example and is controlled by the logic chip 2, but is not limited to the DRAM.

Next, assembling of the semiconductor device (BGA 5) of the present embodiment will be explained.

Figure 2:
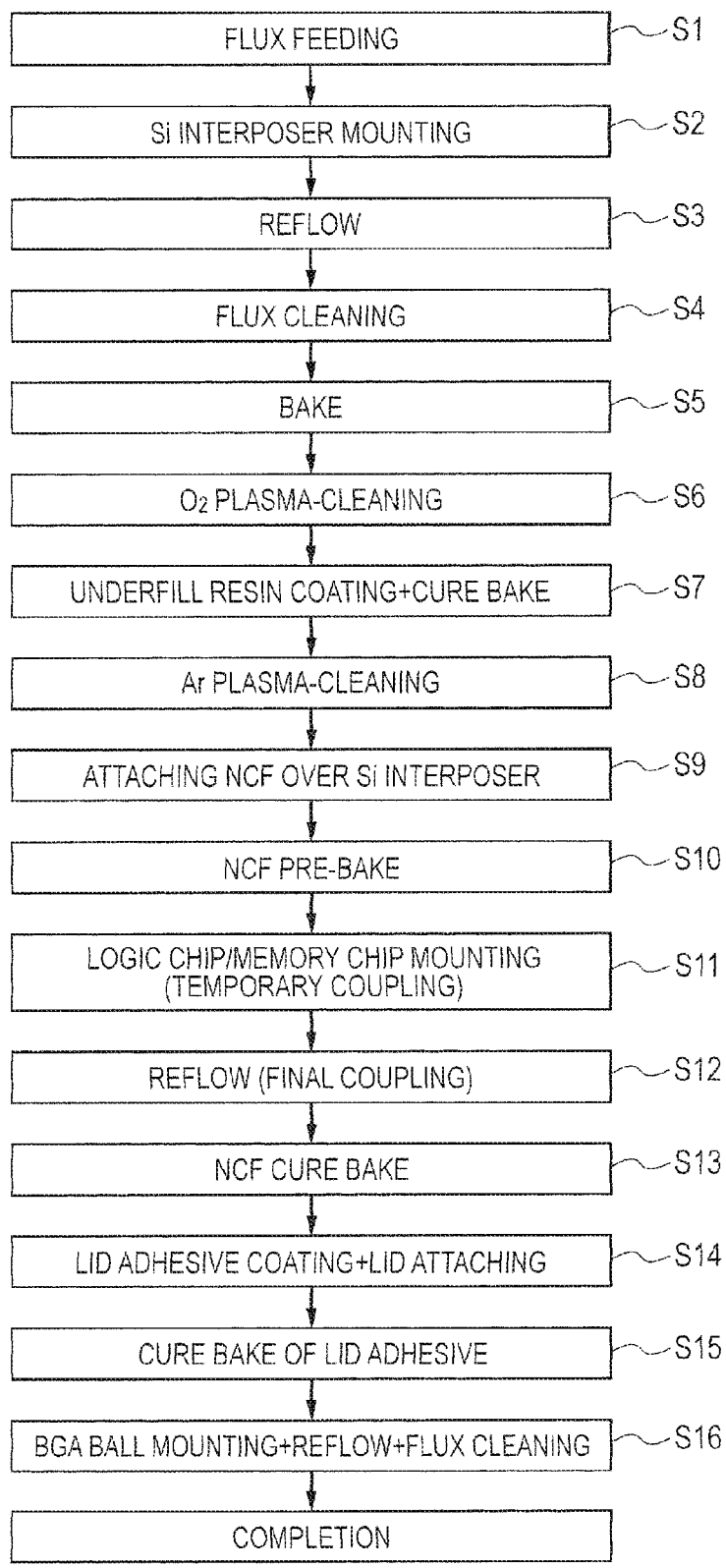
FIG. 2 is a flowchart showing an example of an assembling procedure of the semiconductor device shown in FIG. 1.
Figure 4:
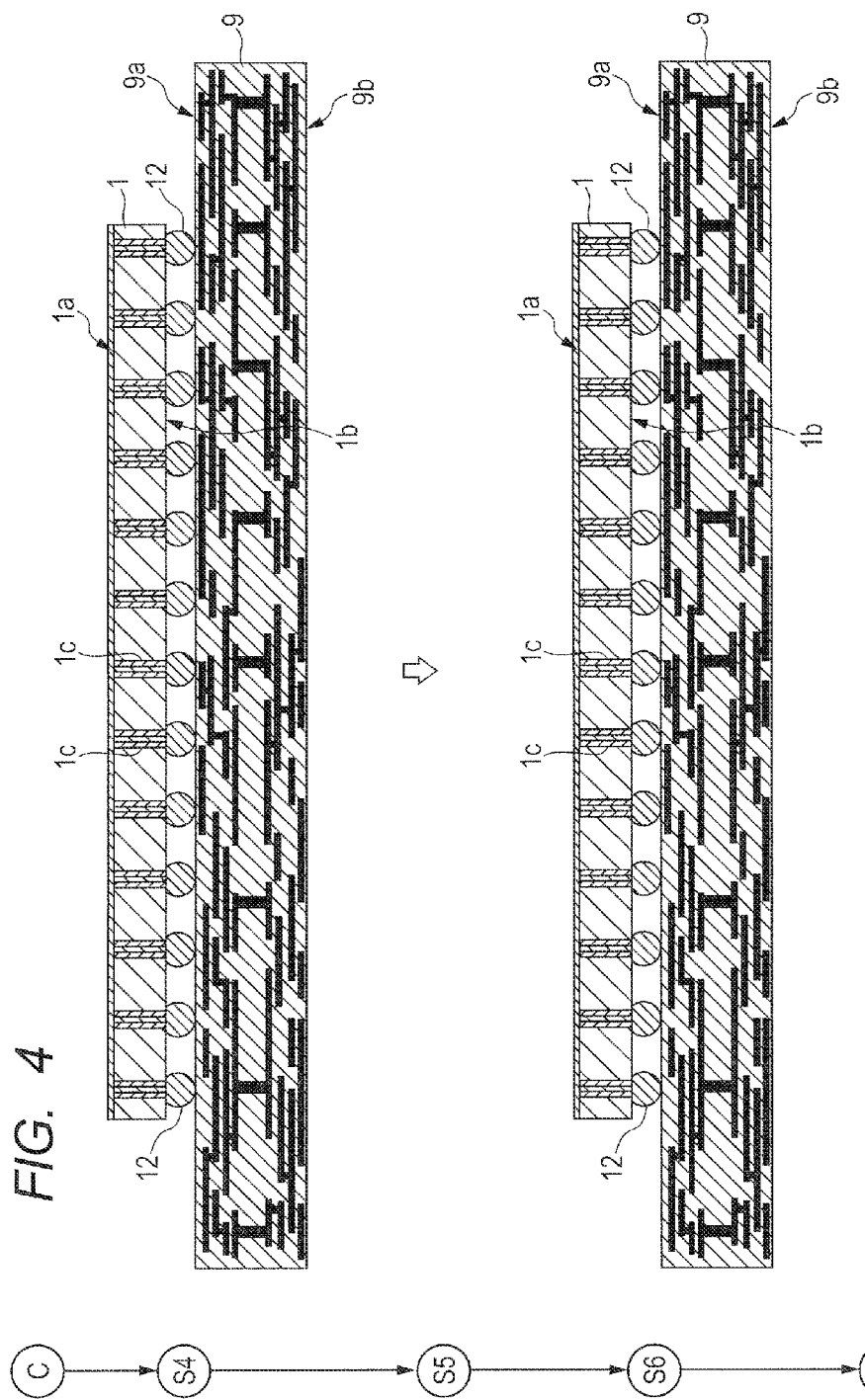
FIG. 4 is a cross-sectional view showing a structure in a part of the steps of the assembling procedure shown in FIG. 2.

FIG. 2 is a flow chart showing an example of an assembling procedure of the semiconductor device shown in FIG. 1, and FIG. 3-FIG. 7 are cross-sectional views respectively showing a structure in a part of the steps of the assembling procedure shown in FIG. 2.

First, "flux feeding" shown in Step S1 of FIG. 2 is executed. In the flux feeding of Step S1, as shown in FIG. 3, flux 15 is fed to each of the plural solder balls 12 arranged over the lower surface 1b of the Si interposer 1 using a flux transcription plate 16.

After the flux feeding, "Si interposer mounting" shown in Step S2 of FIG. 2 is executed. Here, as shown in Step S2 of FIG. 3, solders 13 are coated beforehand in respective electrodes of the upper surface 9a of the printed wiring substrate (first substrate) 9, the plural solder balls 12 arranged in the lower surface 1b of the Si interposer (second substrate) 1 are made to contact the solders 13, and the Si interposer is mounted over the solders 13. In other words, the Si interposer 1 is mounted over the printed wiring substrate 9.

After mounting the Si interposer, "reflow" shown in Step S3 of FIG. 2 is executed. More specifically, an assembly formed of the printed wiring substrate 9 and the Si interposer 1 is put in to a reflow furnace and is heated, the solder balls 12 and the solders 13 are molten, and new plural solder balls 12 are formed. At this time, over the surface of each of the newly formed plural solder balls 12, the flux 15 is formed.

After the reflow, "flux cleaning" shown in Step S4 of FIG. 2 is executed. More specifically, the flux 15 formed over the surface of each of the plural solder balls 12 is removed. At this time, the flux cleaning is executed using a solvent or the water (refer to FIG. 4).

After the flux cleaning, "bake" shown in Step S5 of FIG. 2 is executed. The bake of Step S5 is a heat treatment for drying the printed wiring substrate 9. More specifically, with the aim of reducing the void in the underfill (the underfill 6a shown in FIG. 5 described below) derived from the moisture included in the printed wiring substrate 9, dehumidification bake of the printed wiring substrate 9 is executed. Although the condition of the dehumidification bake then depends on the material, size, and the wiring layout of the printed wiring substrate 9, as an example, the temperature is 120° C.-180° C., and the time is 0.5-6 hrs.

Also, the bake effect cannot be secured when the temperature is too low, and the quality of the substrate changes when the temperature is too high. Therefore, the preferable temperature is approximately 150° C., and, in the case of the substrate with 0.5 μm thickness, the preferable time is approximately 4.5 hrs.

Also, with respect to the atmosphere of the bake furnace, it is preferable that the atmospheric air or an inert gas such as a nitrogen gas is made to flow, and that the oxygen concentration inside the bake furnace is made 10% or less.

After the bake, "$O_2$ plasma-cleaning" shown in Step S6 of FIG. 2 is executed. Here, the stains of the upper surface 9a of the printed wiring substrate 9 are removed by plasma-cleaning using oxygen ($O_2$), and the adhesiveness with the underfill resin (the underfill 6a shown in FIG. 5) described below can be thereby improved.

After the $O_2$ plasma-cleaning, "underfill resin coating+ cure bake" shown in Step S7 of FIG. 2 is executed. As shown in Step S7 of FIG. 5, the underfill (resin) 6a is poured (coated) to the gap between the printed wiring substrate 9 and the Si interposer 1. At this time, the underfill 6a is poured also to the side surface of the Si interposer 1 to a degree the underfill 6a climbs.

Also, because the upper surface 9a of the printed wiring substrate 9 is plasma-cleaned before coating the underfill 6a as described above, the adhesiveness between the printed wiring substrate 9 and the underfill 6a is excellent.

After the underfill resin coating+cure bake, "Ar plasma-cleaning" shown in Step S8 of FIG. 2 is executed. In other words, the upper surface 1a of the Si interposer 1 is plasma-cleaned. More specifically, with the aim of improving the adhesiveness between the Si interposer 1 and the NCF 10 described below (preventing peeling off of the Si interposer 1 and the NCF 10) and reducing the void in the NCF, the Si interposer 1 is subjected to a plasma-cleaning treatment. At this time, the gas generating the plasma may be argon (Ar), oxygen ($O_2$), or other gas mixture.

For example, when Ar gas is used as the gas generating the plasma, in Ar plasma-cleaning, the Ar atoms are made to collide on the surface of the Si interposer 1, and the impurities of organic substances and the like can be removed. Also, because fine unevenness can be formed on the surface of the Si interposer 1 by making the Ar atoms collide on the surface of the Si interposer 1, the adhesiveness with the NCF 10 described below can be thereby improved.

After the Ar plasma-cleaning, "attaching NCF over Si interposer" shown in Step S9 of FIG. 2 is executed. In other words, the NCF (insulative adhesive) 10 is disposed over the upper surface 1a of the Si interposer 1.

Here, the NCF 10 has a 3-layer structure sandwiched by the light peel-off film (material: PET) and the heavy peel-off film (material: PET) or a 2-layer structure in which the heavy peel-off film is attached to one surface of the NCF 10, and is wound around a reel in a state of the 3-layer structure or the 2-layer structure. Also, the light peel-off film of the 3-layer structure product is designed and manufactured so as to be easily peeled-off from the NCF body compared to the heavy peel-off film.

Next, the procedure of feeding the NCF 10 to the Si interposer 1 (refer to Step S9 of FIG. 5) that has finished the dehumidifying bake (Step S5 of FIG. 2) and the plasma-cleaning treatment (Step S8 of FIG. 2) will be explained.

First, the heavy peel-off film and the NCF 10 are cut out into a predetermined size, and are disposed over the upper surface 1a of the Si interposer 1 in the direction the NCF 10 contacts the Si interposer 1 (in the case of the 3-layer structure product, the 3-layer structure product is punched after the light peel-off film is peeled off). In punching the NCF 10 by a punch, there is also a case of executing punching while heating the NCF 10 with the aim of preventing generation of a burr of the NCF 10. The temperature of the NCF 10 then is preferable to be approximately 40° C.-80° C. because there is no effect in preventing the burr when the temperature is too low and thermosetting of the NCF 10 proceeds excessively when the temperature is too high.

Next, the attaching work of the NCF 10 to the Si interposer 1 is executed. The attaching work is executed by applying the pressure of approximately 0.05 MPa-0.5 MPa for 5-20 sec by a diaphragm to the heavy peel-off film side while being heated to 60° C.-100° C. under the reduced pressure of 0.05 kPa-0.5 kPa using a vacuum laminate device.

Lastly, the heavy peel-off film is removed to achieve a state that only the NCF 10 is attached to the upper surface 1a of the Si interposer 1.

After attaching the NCF over the Si interposer, "NCF pre-bake" shown in Step S10 of FIG. 2 is executed. In other words, after attaching the NCF and before mounting the semiconductor chip, the bake treatment (pre-bake: heat treatment) of the NCF 10 is executed.

More specifically, with the aim of removing excessive solvent and moisture contained in the NCF which become a cause of the void in the NCF, the Si interposer 1 attached with the NCF 10 is subjected to heat treatment (the NCF 10 is pre-baked) in a bake furnace. The temperature of the Si interposer 1 in this heat treatment is 60° C.-180° C., and the time is approximately 0.5-3 hrs. It is preferable that the temperature is approximately 80° C. and the time is approximately 1.5 hrs.

In this condition, the temperature is lower compared to the temperature at which the printed wiring substrate 9 is subjected to the bake treatment (bake of Step S5 of FIG. 2) (150° C., for example), and the time is shorter compared to the time of the bake treatment of the printed wiring substrate 9 (4.5 hrs, for example).

In the pre-bake of the NCF 10, when the temperature is too high or the time is too long, the NCF 10 is cured, whereas when the temperature is too low or the time is too short, a state of not being cured sufficiently (removal of the solvent and moisture becomes insufficient) comes up.

Therefore, it is important to execute the pre-bake of the NCF 10 within the appropriate range of the temperature and time.

Also, with respect to the atmosphere of a bake furnace in the pre-bake of the NCF 10, the atmospheric air or an inert gas such as the nitrogen gas may be used. When an inert gas is used, it is preferable to make the oxygen concentration in the furnace 10% or less.

After the NCF pre-bake, "logic chip/memory chip mounting (temporary coupling)" shown in Step S11 of FIG. 2 is executed. In other words, as shown in Step S11 of FIG. 6, the respective semiconductor chips (the logic chip 2 and the memory chips 3) are mounted (temporarily coupled) over the upper surface 1a of the Si interposer 1 through the NCF 10.

Figure 8:
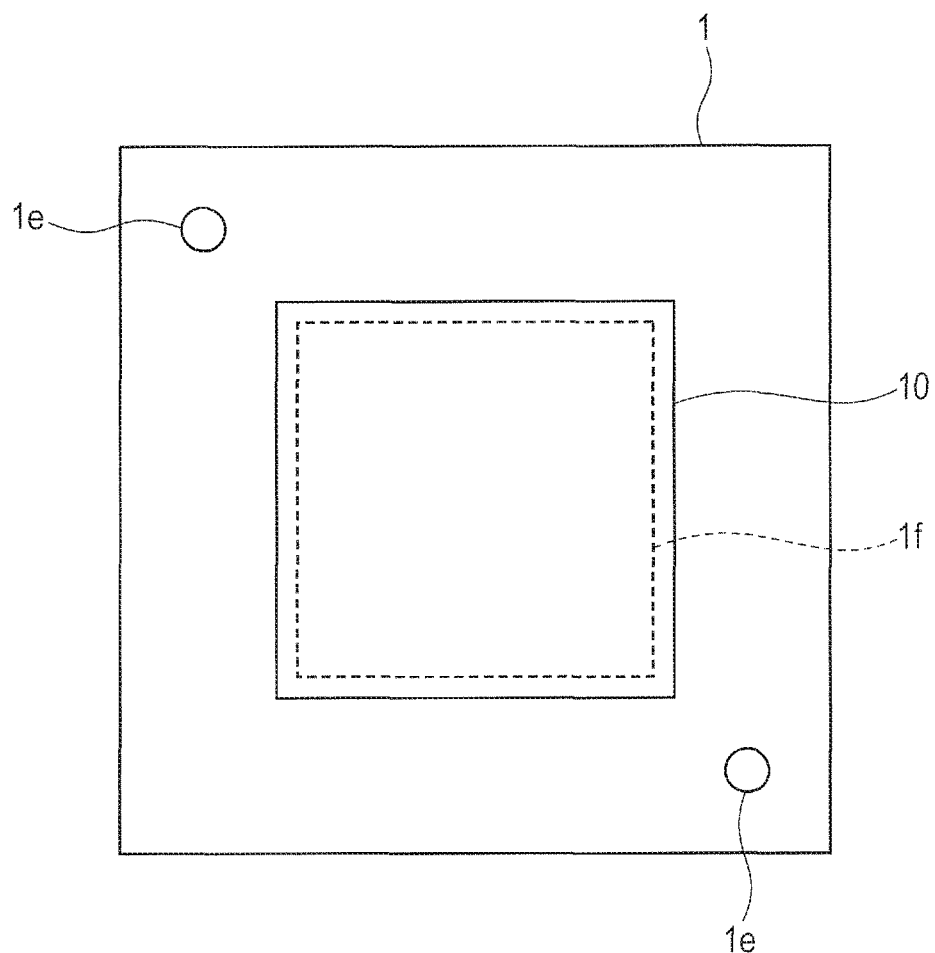
FIG. 8 is a plan view showing an example of a recognizing method of alignment marks at the time of mounting a chip of the assembling procedure shown in FIG. 2.
Figure 9:
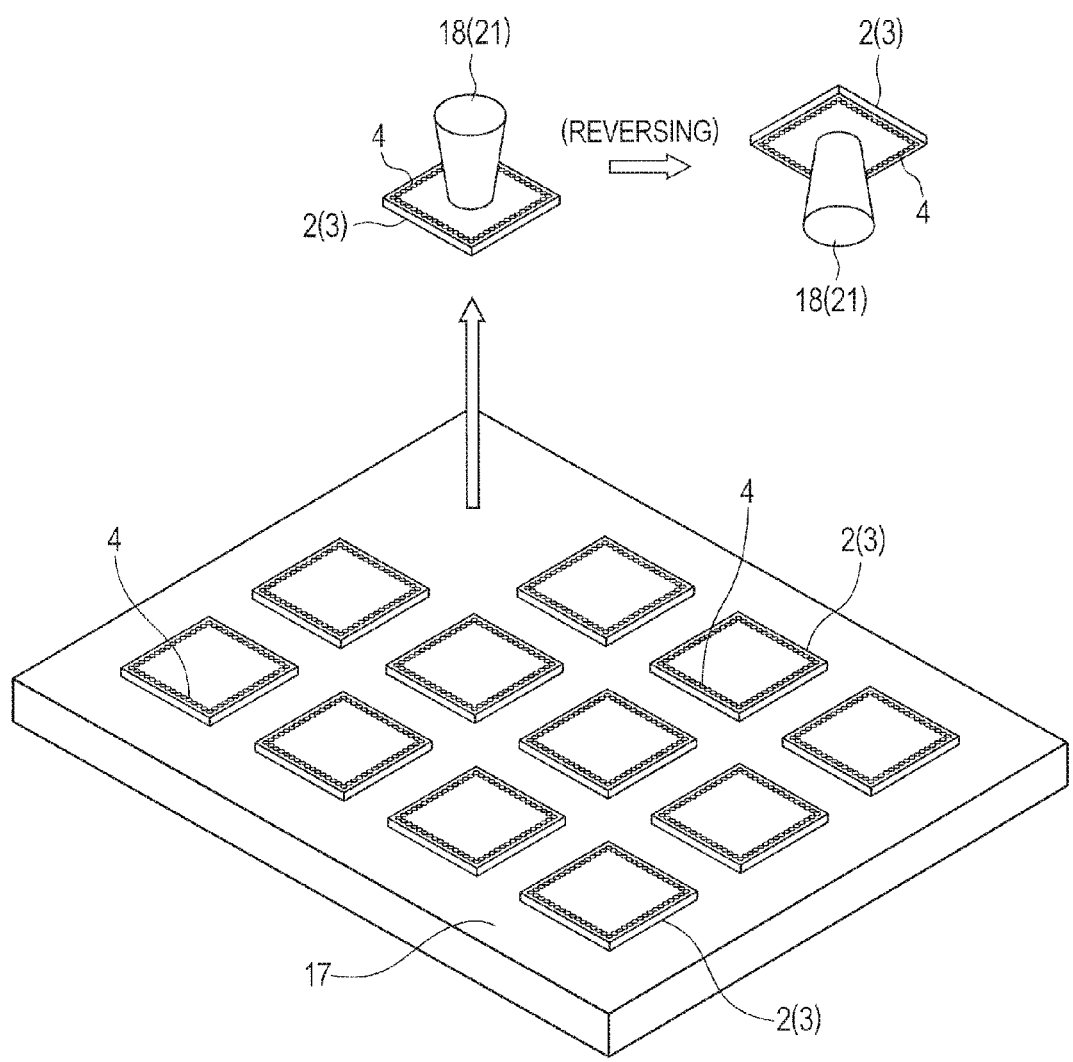
FIG. 9 is a perspective view showing an example of a mounting method at the time of mounting a chip of the assembling procedure shown in FIG. 2.
Figure 10:
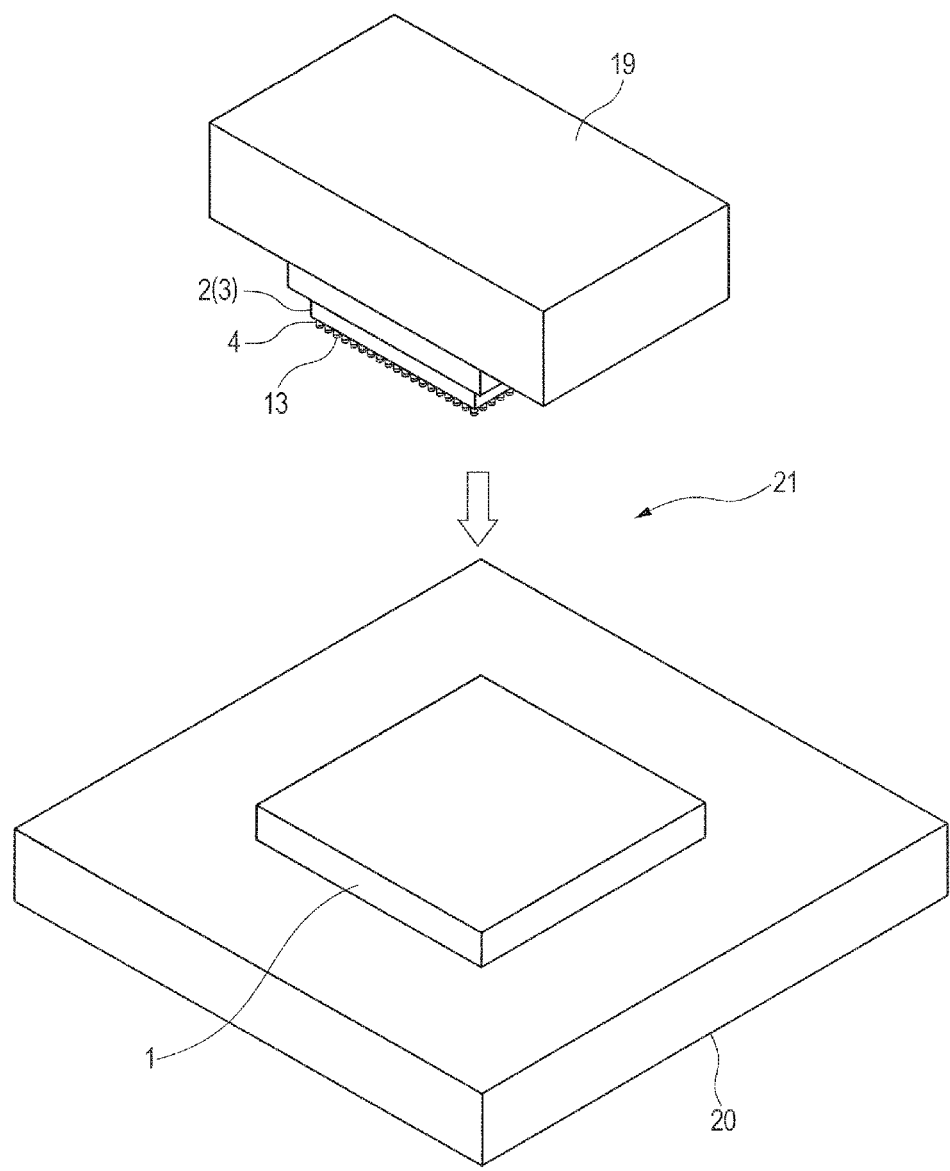
FIG. 10 is a perspective view showing an example of a mounting method at the time of mounting a chip of the assembling procedure shown in FIG. 2.
Figure 11:
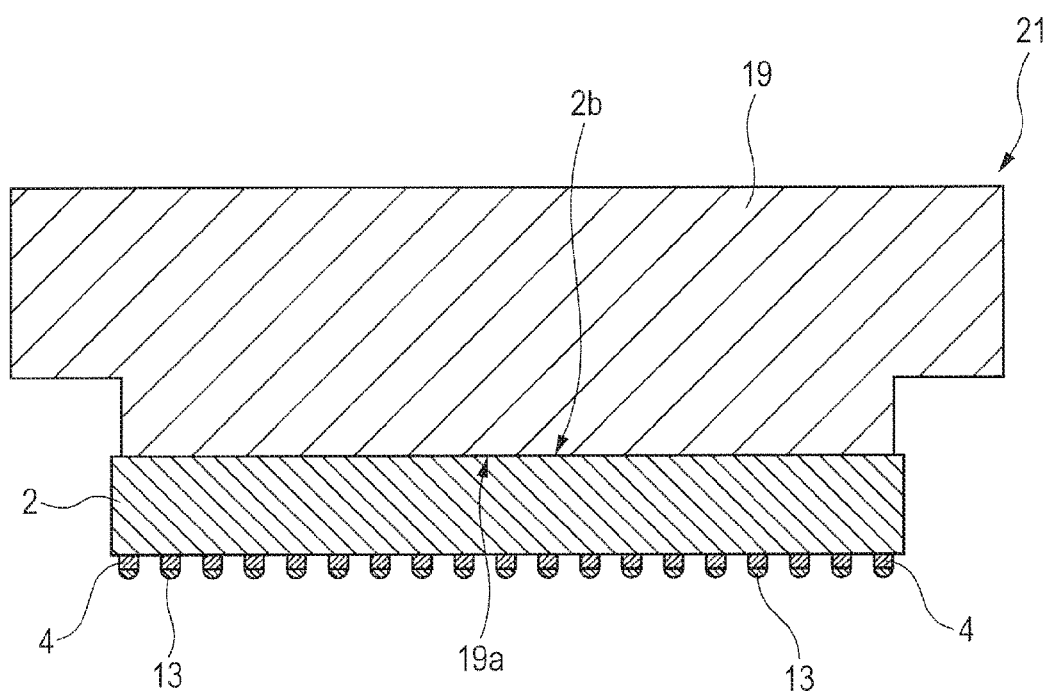
FIG. 11 is a cross-sectional view showing an example of a chip absorption state at the time of mounting a chip of the assembling procedure shown in FIG. 2.
Figure 12:
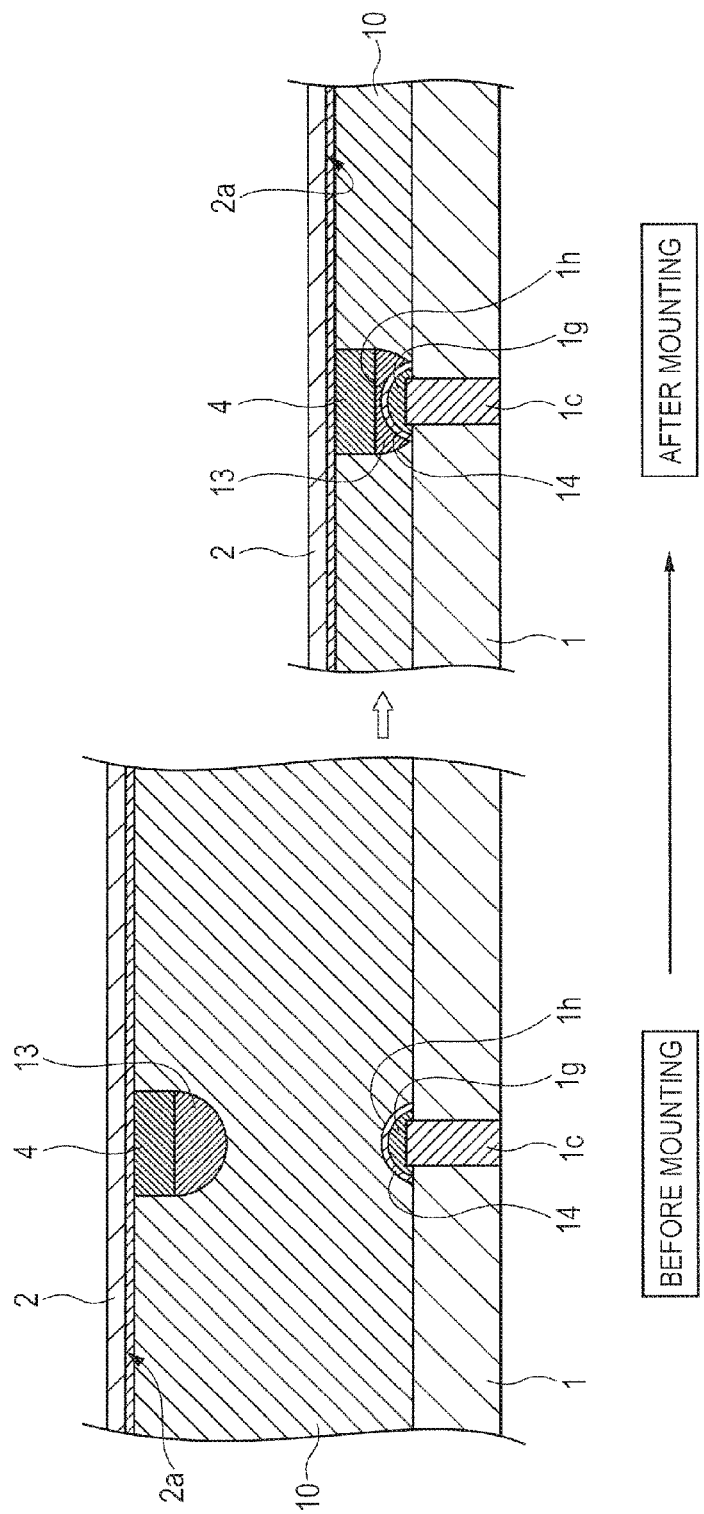
FIG. 12 is an enlarged partial cross-sectional view showing an example of a structure before coupling and after coupling at the time of flip chip coupling of the assembling procedure shown in FIG. 2.

Here, FIG. 8 is a plan view showing an example of a recognizing method of the alignment marks at the time of mounting a chip of the assembling procedure shown in FIG. 2, FIG. 9 is a perspective view showing an example of a mounting method at the time of mounting a chip of the assembling procedure shown in FIG. 2, and FIG. 10 is a perspective view showing an example of a mounting method at the time of mounting a chip of the assembling procedure shown in FIG. 2. Also, FIG. 11 is a cross-sectional view showing an example of a chip absorption state at the time of mounting a chip of the assembling procedure shown in FIG. 2, and FIG. 12 is an enlarged partial cross-sectional view showing an example of a structure before coupling and after coupling at the time of flip chip coupling of the assembling procedure shown in FIG. 2.

In the chip mounting step, in concrete terms, the semiconductor chips (the logic chip 2, the memory chips 3) are mounted over the Si interposer 1 having been attached with the NCF using a flip chip bonder 21 as shown in FIG. 10. In other words, the Si interposer 1 already attached with the NCF is fixed to a stage 20 of the flip chip bonder 21 by way of absorption and the like. Also, if the temperature of the Si interposer 1 of the time when it is fixed to the stage 20 of the flip chip bonder 21 is too high, the time the NCF 10 is cured to a degree the semiconductor chip cannot be mounted becomes short, whereas if the temperature is too low to the contrary, such adverse effects arise that mounting of the semiconductor chip becomes hard because the viscosity of the NCF 10 is high, and that it becomes the cause of generation of the void when the semiconductor chip is mounted.

Therefore, the temperature of the stage 20 of the flip chip bonder 21 is set so that the temperature of the Si interposer 1 becomes 60° C.-100° C. because the temperature at which the thermosetting reaction of the NCF 10 is accelerated is approximately 100° C. in general.

In the chip mounting step, first, as shown in FIG. 9, out of the logic chips 2 (similar also with respect to the memory chips 3) stored in a chip tray 17, the logic chip 2 to be picked up is absorbed and picked up by a collet (chip absorbing tool) 18, and the logic chip 2 in the state of being absorbed by the collet 18 is thereafter reversed by a reversing mechanism of the flip chip bonder 21. Also, the rear surface 2b of the logic chip 2 is absorbed and held by a bonding tool 19 of the flip chip bonder 21 as shown in FIG. 10, and, in this state, the logic chip 2 is transported to above the Si interposer 1 that is held by the stage 20.

Further, the alignment marks (marks) 1e of the Si interposer 1 shown in FIG. 8 are recognized from the top by a camera not illustrated, whereas the alignment marks of the logic chip 2 are recognized from the bottom by a camera not illustrated, and the logic chip 2 and the Si interposer 1 are positioned with each other based on the respective recognition results.

Also, as shown in FIG. 8, the alignment marks 1e for recognizing the position of the Si interposer 1 are formed at positions outside the NCF 10 that is disposed at a chip mounting region 1f over the upper surface 1a of the Si interposer 1. Because the alignment marks 1e are formed at the positions outside the NCF 10 thus, the alignment marks 1e of the Si interposer 1 can be recognized even if it is after the NCF 10 is attached and immediately before the logic chip 2 is mounted.

Thus, the logic chip 2 and the Si interposer 1 can be positioned with each other with a high accuracy.

With the configuration described above, in a state the logic chip 2 is absorbed and held by the bonding tool 19 of the flip chip bonder 21 and in a state the logic chip 2 and the Si interposer 1 are positioned with each other, the logic chip 2 is mounted over the Si interposer 1.

At this time, when contact of the logic chip 2 and the Si interposer 1 attached with the NCF 10 is detected, as shown in FIG. 12, the bonding tool 19 of the flip chip bonder 21 applies a load on the logic chip 2 and presses in the logic chip 2 to the Si interposer 1 side. Also, the columnar Cu pillars 4 formed on the chip side and terminal sections (electrodes) 1h that are the electrode terminals on the Si interposer 1 side and are coupled with the penetration vias 1c are made to contact each other, and the solders 13 at the distal end of the columnar Cu pillars 4 formed on the chip side are deformed (refer to "after mounting" of FIG. 12).

Further, because the distance of the gap between the logic chip 2 and the Si interposer 1 becomes almost same between the shape after deformed and coupled and the shape of the coupled section after the reflow treatment, even when the logic chip 2 is mounted over the Si interposer 1 so as to be inclined to some extent, the logic chip 2 can be mounted so that all of the columnar Cu pillars 4 can sufficiently contact the electrode terminals (the terminal sections 1h) described above of the Si interposer 1.

More specifically, the load and the temperature applied to the logic chip 2 and the time of application of them are adjusted so that the solders 13 of the distal end of the columnar Cu pillars 4 are deformed and the height thereof becomes lower than that before deformation by 5 μm-15 μm.

It is preferable that the temperature of the electrode terminals (the terminal sections 1h) described above at this time is a highest possible temperature within a range of the temperature below the solder melting point (the melting point of the solder 13). More specifically, after the logic chip 2 and the Si interposer 1 are positioned with each other, as shown in FIG. 12, each of the solders 13 is heated and pressurized to be deformed at a temperature lower than the melting point of the solder 13 that is coated at the distal end of each of the plural Cu pillars 4 and at a highest possible temperature, and thereby each of the plural terminal sections 1h is made to dent into each of the solders 13. In other words, the Cu pillars 4 are pressed in to the terminal sections 1h at a temperature of a degree not melting the solder 13.

In concrete terms, in the case of a tin/silver-based lead-free solder, because the melting point of the solder is approximately 230° C., the suitable temperature of the coupling section at the time of mounting is approximately 200° C.-220° C. When the temperature of the bonding tool 19 of the flip chip bonder 21 is raised or lowered, it possibly results in that the tact time deteriorates, and therefore it is preferable to keep the temperature constant.

Also, with respect to the structure of the terminal section (electrode) 1h that is coupled with the penetration via 1c of the Si interposer 1, as shown in "before mounting" of FIG. 12, a metal to which the solder 13 is solid-phase-diffused namely an Au plating 14 for example is formed on the surface of a Ni plating 1g, and coupling of the Cu pillar 4 on the chip side and the terminal section (electrode) 1h on the Si interposer 1 side is effected by the solder 13 and the Au plating 14.

With the configuration described above, the logic chip 2 is temporarily coupled with the Si interposer 1. By a similar method, the memory chips 3 are also temporarily coupled. However, laminating 3 stages of the memory chips 3 is executed beforehand, and the underfill 6b is poured in to the gaps between the first stage and the second stage and between the second stage and the third stage by the retrofitting (pouring later) method, respectively.

Also, in the chip mounting step of the present embodiment, as shown in FIG. 11, the logic chip 2 is absorbed and held by an absorbing surface 19a of the bonding tool (head) 19 of the flip chip bonder 21, and the logic chip 2 is mounted over the upper surface 1a of the Si interposer 1 shown in FIG. 10.

At this time, as shown in FIG. 11, the plane size of the absorbing surface 19a of the bonding tool 19 is smaller than the plane size of the rear surface 2b of the logic chip 2. However, the plane size of the absorbing surface 19a of the bonding tool 19 may be equal to the plane size of the rear surface 2b of the logic chip 2.

After mounting the logic chip/memory chip, "reflow (final coupling)" shown in Step S12 of FIG. 2 (Step S12 of FIG. 6) is executed. Here, the Si interposer 1 mounted with the logic chip 2 and the memory chips 3 as well as the NCF 10 are heated by reflow, and each of the plural terminal sections 1h of the Si interposer 1 and each of the plural electrode pads 2c (refer to FIG. 1) of the logic chip 2 are electrically coupled with each other through the plural Cu pillars 4 and solders 13.

At that time, as shown in FIG. 12, because the NCF 10 is disposed over the upper surface 1a of the Si interposer 1 beforehand by the retrofitting method, each of the plural terminal sections 1h and each of the plural electrode pads 2c are electrically coupled (coupled finally) with each other through the plural Cu pillars 4 in a state the NCF 10 is disposed around each of the plural Cu pillars 4.

More specifically, the Si interposer 1 that is mounted with the logic chip 2 and the memory chips 3 respectively by having gone through the chip mounting step and the printed wiring substrate 9 that supports this Si interposer 1 are subjected to a reflow treatment in a conveyor type reflow furnace. Also, each of the logic chip 2 and the memory chips 3 is in a state that coupling between the columnar Cu pillar 4 of the surface of each chip and the terminal section 1h on the Si interposer 1 side is maintained by a retaining force of the NCF 10 and contact of the columnar Cu pillar 4 and the terminal section 1h of the Si interposer 1.

Thus, the terminal section 1h of the Si interposer 1 is soldered, formation of an alloy layer is promoted, and the logic chip 2 (similar with respect to the memory chip 3 also) and the Si interposer 1 are more securely coupled with each other physically also.

Figure 13:
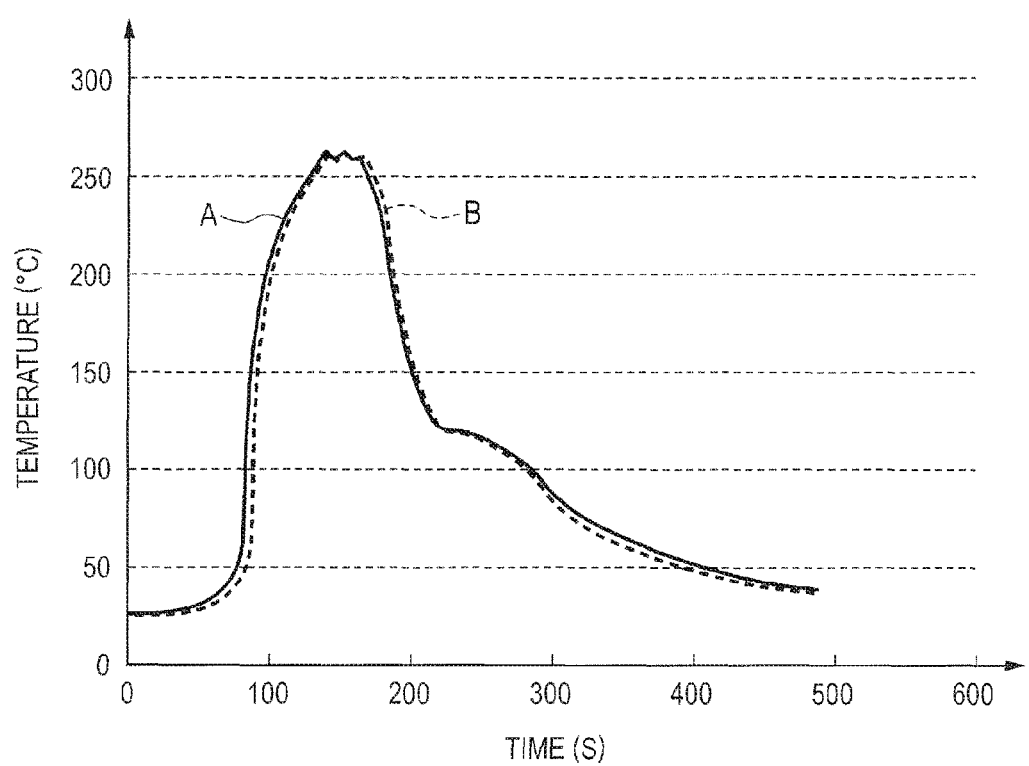
FIG. 13 is a graph showing an example of a temperature profile at the time of reflow of the assembling procedure shown in FIG. 2.

Here, FIG. 13 is a graph showing an example of a temperature profile at the time of reflow of the assembling procedure shown in FIG. 2.

As shown in FIG. 13, as the temperature profile, such temperature profile of reaching a peak temperature as soon as possible after the Si interposer 1 mounted with the semiconductor chip enters the reflow furnace and the temperature starts to rise is preferable. The reason is that, because the temperature can reach the solder melting point at earlier timing, the solder can be molten while the curing rate of the NCF 10 is lowest possible, and that the shape of the solder of the coupling section of the semiconductor chip and the Si interposer I can be expected to secure the smoothness by the surface tension of the molten solder. Also, in FIG. 13, the line segment A shows the profile of the portion that entered the reflow furnace earlier, whereas the line segment B shows the profile of the portion that entered the reflow furnace later.

When the shape of the coupling section is smooth, concentration of the stress such as the thermal stress can be relaxed in general, and therefore improvement of the reliability of the coupling section can be expected. In concrete terms, it is preferable that start of temperature rise-reaching peak temperature is 100 s or less. Although it is necessary that the peak temperature is the solder melting point or above, when it is too high, excessive thermal load comes to be applied, and therefore it is set to the range of 230° C.-260° C. With respect to the reflow method, a hot air method or an infrared method which is popular in assembling a semiconductor can be employed. An inert gas such as a nitrogen gas can be also used An example of the operation of an actual reflow step will be described. In feeding the Si interposer 1 mounted with the semiconductor chip into the reflow furnace, the Si interposer 1 is disposed in such direction that a predetermined direction of the Si interposer 1 agrees the moving direction of the conveyor. At this time, the Si interposer 1 may be disposed by 2 sets side by side. Also, the Si interposer 1 can be fed consecutively as soon as a preceding Si interposer 1 has been transported. Although the conveyor speed of the reflow furnace depends on the specification of the furnace, as a common reflow furnace, there exists a reflow furnace that can achieve the temperature profile described above while executing the feed at 1-2 m/min, for example. In this case, 1 to 3 times/min of the feeding number of times to the reflow furnace is possible. In calculating the tact time of a concrete reflow step, 30 sets of the semiconductor device can be assembled from 1 sheet of the Si interposer 1, and, when the feeding number of times is made 2 times/min in feeding 2 sheets at the same time, the tact time of the reflow becomes 0.5 s/IC.

After the reflow (final coupling), "NCF cure bake" shown in Step S13 of FIG. 2 (Step S13 of FIG. 6) is executed. Here, the cure bake is executed in which the printed wiring substrate 9 including the Si interposer 1 that has finished the reflow and is mounted with the semiconductor chip is subjected to a heat treatment in a bake furnace while being stored in a magazine made of metal and so on, and the NCF is thereby cured.

By this cure bake, the curing reaction rate of the NCF 10 is made 95% or more. Although the condition of the cure bake is different according to the NCF 10, for example, the temperature is 150° C.-200° C., preferably 180° C., and the time is approximately 20-60 min, preferably 20 min (the time over which the actual temperature of the sample is said temperature). Also, with respect to the atmosphere of the bake furnace when the cure bake is executed, the atmospheric air or an inert gas such as a nitrogen gas may be made to flow.

After the NCF cure bake, "lid adhesive coating+lid attaching" shown in Step S14 of FIG. 2 (Step S14 of FIG. 6) is executed.

Figure 6:
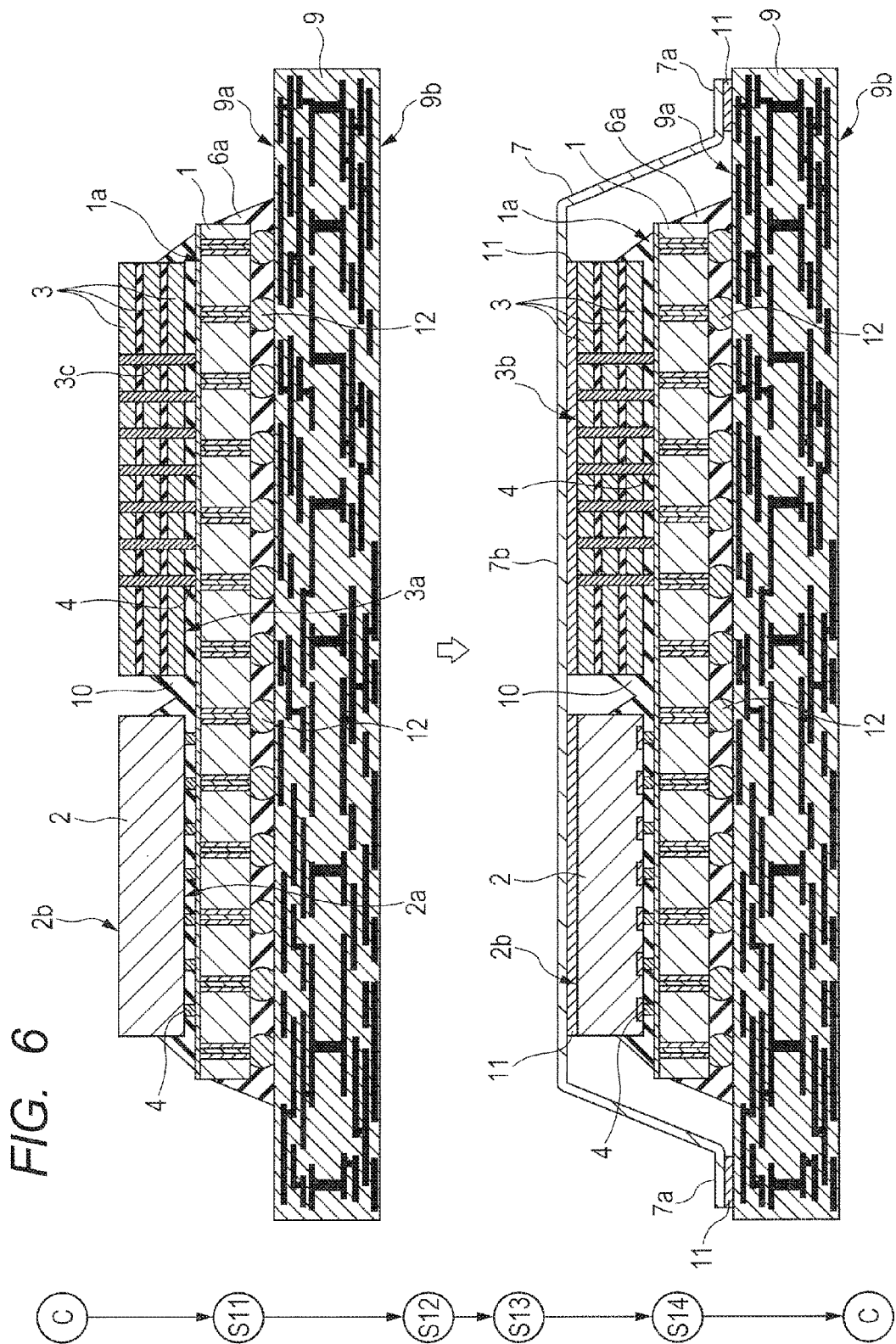
FIG. 6 is a cross-sectional view showing a structure in a part of the steps of the assembling procedure shown in FIG. 2.

Here, as shown in Step S14 of FIG. 6, the edge sections 7a of the lid 7 and the printed wiring substrate 9 are coupled with each other by the adhesives 11, and the rear surface 2b of the logic chip 2 and the ceiling section 7b of the lid 7 as well as the rear surface 3b of the memory chip 3b of the third stage and the ceiling section 7b of the lid 7 are coupled with each other by the adhesives 11, respectively.

After the lid adhesive coating+lid attaching, "cure bake of lid adhesive" shown in Step S15 of FIG. 2 (Step S15 of FIG. 7) is executed. Here, the adhesive 11 of the lid 7 is heated, and the bake treatment is executed.

After the cure bake of lid adhesive, "BGA ball mounting+ reflow+flux cleaning" shown in Step S16 of FIG. 2 (Step S16 of FIG. 7) is executed. Here, as shown in Step S16 of FIG. 7, the plural BGA balls 8 are attached to the lower surface 9b of the printed wiring substrate 9 by reflow, and thereafter, the flux 15 formed over the surface of each BGA ball 8 is cleaned (flux cleaning) and removed.

Thus, assembling of the BGA 5 shown in FIG. 1 of the present embodiment is completed.

Next, the mechanism of flip chip coupling in assembling the semiconductor device of the present embodiment will be explained.

The columnar bump electrode (Cu pillar 4) formed over the surface of each semiconductor chip is formed by plating the UBM (Under Bump Metal), Cu, and the solder in this order over the aluminum (Al) pad of the semiconductor chip. A Ni layer may be formed between Cu and the solder. Because a reflow treatment is executed after the solder plating, the shape of the solder 13 at the distal end of the columnar bump electrode becomes a rounded shape.

Furthermore, the solder is relatively softer than other metals, and, particularly in the temperature range near the solder melting point in mounting the semiconductor chip over the Si interposer 1, the hardness of the solder lowers, and the solder becomes liable to deform. Therefore, when the solder 13 at the distal end of the columnar bump electrode is made to contact the terminal section 1h of the Si interposer 1, first, the solder 13 at the distal end of the columnar bump electrode deforms. Simultaneously with this deformation, solid phase diffusion is effected between the solder 13 at the distal end of the columnar bump electrode (Cu pillar 4) and the terminal section 1h of the Si interposer 1, and a coupling force for fixing the semiconductor chip to the Si interposer 1 is secured.

In addition, also by promoting the thermosetting reaction of the NCF, a force for fixing the semiconductor chip to the Si interposer 1 is secured. It is suitable that the concrete curing reaction rate of the NCF 10 (here, the curing reaction rate at the time of temporary coupling of the chip) is 50%-80%. When the curing reaction rate is too low, the capability for fixing the semiconductor chip to the Si interposer 1 becomes insufficient. On the other hand, when the curing reaction rate is increased at the time of the temporary coupling, the shape change of the coupling section by the surface tension of the solder in the reflow step that is the next step comes to be hardly expected. By making the curing reaction rate 50%-80%, flowing out of tin (Sn) and the like of the time when the solder is molten in the later step can be prevented. Further, flowing out of a resin also can be prevented.

In mounting (temporary coupling) of the chip, it is preferable not to melt the solder, to promote solid phase diffusion between metals as much as possible, and to execute mounting at a highest possible temperature within a range the solder is not molten in order to efficiently carry out the thermosetting reaction of the NCF 10.

Also, if the fixing force secured by solid phase diffusion between the columnar bump electrode (Cu pillar 4) and the electrode terminal (the terminal section 1h) of the substrate and thermosetting of the NCF is weak, when absorption by the stage 20 is released and the process shifts to the reflow step, the columnar bump electrode (Cu pillar 4) and the terminal section 1h of the Si interposer 1 depart from each other by vibration and the like, for example.

In that case, even when the reflow is executed, it becomes hard to electrically couple the semiconductor chip and the Si interposer 1 with each other.

Also, because the temperature of the semiconductor chip mounted is higher than the temperature of the Si interposer 1 by 100° C. or more, when the material of the stage 20 that absorbs the Si interposer 1 is excellent in thermal conduction, it takes time in heating the coupling section of the semiconductor chip and the Si interposer 1 as well as the NCF 10 to carry out the solid phase diffusion and in increasing the curing rate of the NCF 10. Therefore, for the stage 20 for absorbing the flip chip bonder 21, it is preferable to use a ceramic material and a glass material having relative low thermal conductivity.

According to the manufacturing method of the semiconductor device of the present embodiment, the effects below can be secured.

That is to say, by plasma-cleaning the surface of the Si interposer 1 before attaching the NCF 10 to the Si interposer 1, the impurities and the like attached to the surface (the upper surface 1a) of the Si interposer 1 can be removed. The contamination of the Si interposer 1 occurs in the bake step and the like, for example. More specifically, when the substrate and the organic material such as a resin are subjected to a heat treatment, various chemical substances are emitted and are attached to a tool used in assembling, components and the like which results in deterioration of the quality of the product (semiconductor device) and deterioration of the reliability also.

Therefore, by plasma-cleaning the surface of the Si interposer 1 before attaching the NCF 10 to the Si interposer 1 as done in the present embodiment, the impurities and the like attached to the surface of the Si interposer 1 can be removed, and adhesiveness between the surface of the Si interposer 1 and the NCF 10 can be thereby improved.

As a result, the Si interposer 1 and the NCF 10 come to be hardly peeled off from each other, and the quality and reliability of the BGA 5 can be improved.

Also, when the semiconductor chip is mounted over the Si interposer 1, it is possible that the NCF 10 is pushed out from beneath the semiconductor chip and crimes the side surface of the semiconductor chip, and that the NCF 10 is attached to the bonding tool 19 that absorbs and holds the semiconductor chip. Therefore, with respect to the bonding tool 19 that absorbingly holds, mounts, heats, and applies a load to the semiconductor chip, in order to prevent the NCF 10 from being attached to the bonding tool 19, as shown in FIG. 11, the plane size of the absorbing surface 19a of the bonding tool 19 is made equal to or slightly smaller than the plane size of the semiconductor chip. For example, the plane size of the absorbing surface 19a of the bonding tool 19 is made smaller than the plane size of the semiconductor chip by approximately 0.2 mm per one side of the chip.

More specifically, when the semiconductor chip is mounted, the amount of the NCF 10 pushed out over the side surface from beneath the semiconductor chip depends on the plane size of the semiconductor chip and the thickness of the NCF 10, and, when the pushed out amount is much, the NCF 10 is liable to be attached to the bonding tool 19 that mounts the semiconductor chip. Also, when the semiconductor chip is thick, the NCF is hardly attached to the bonding tool 19, and, to the contrary, when the semiconductor chip becomes thin, the NCF 10 is liable to be attached to the bonding tool 19.

Therefore, in the present embodiment, as shown in FIG. 11, the plane size of the absorbing surface 19a of the bonding tool 19 is either smaller than or equal to the plane size of the rear surface 2b of the logic chip 2, and thereby, even when the NCF 10 is pushed out from beneath the logic chip 2 and crimes the side surface of the semiconductor chip at the time of mounting the chip, the NCF 10 can be prevented from being attached to the absorbing surface 19a.

As a result, the absorbing surface 19a of the bonding tool 19 can be prevented from being stained by the NCF 10, and it can be also prevented that a stain of the absorbing surface 19a is attached to the semiconductor chip, and so on Thus, the quality and reliability of the semiconductor device (BGA 5) can be improved.

Also, in assembling the semiconductor device of the present embodiment, because the solder 13 at the distal end of the columnar Cu pillar 4 formed over the chip surface by reflow is molten to electrically couple the semiconductor chips and the Si interposer 1 with each other, the coupling section can be heated more uniformly compared to the NCF method in which the semiconductor chips and the substrate are coupled with each other by executing heating, soldering and cooling the chips consecutively one by one. Therefore, the uniformity of the workmanship of coupling of the semiconductor chip and the Si interposer 1 within one chip can be improved, and high coupling quality can be secured in the semiconductor device (BGA 5).

Particularly, although heat emission is liable to be effected at 4 corners of the semiconductor chip and the workmanship of the coupling section of the solder is liable to be dispersed according to the location within one chip, in the present embodiment, because the coupling section can be heated uniformly, the uniformity can be improved and high coupling quality of the semiconductor device (BGA 5) can be secured.

Next, the effects on the production efficiency in assembling the semiconductor device of the present embodiment will be explained. According to the technology on which the inventors of the present application compared and studied, when the semiconductor chip is mounted over the substrate, heating to the solder melting point or above, soldering, and cooling to the solder melting point or below are executed. Therefore, it took a long time by that portion. In concrete terms, it took 7 sec-10 sec/IC.

On the other hand, according to the present embodiment, because heating, soldering and cooling are not executed in mounting the semiconductor chip over the Si interposer 1 and the solder is molten in the reflow furnace, although the number of step increases, the mounting step can be finished within a short time. Also, because the reflow furnace has a large processing capacity, as a result, in the manufacturing method of the semiconductor device of the present embodiment, the tact time can be shortened and the production efficiency can be improved compared to the technology that was compared and studied. The NCF 10 has been developed as a quickly curing type resin in general, and at 220° C., the curing rate reaches approximately 70% that is sufficient to achieve the method of the present embodiment within approximately 3 sec.

Also, in the mounting step of the chip, the tact time of 5 sec/IC can be expected including chip pick up and mounting position recognition. Because the tact time of the reflow step of approximately 0.5 sec/IC can be expected as described above, according to the method of the present embodiment, 5.5 sec of the tact time in the flip chip bonding step for producing 1 set of the semiconductor device can be expected. Thus, the tact time can be shortened by approximately 30% compared to the method that was compared and studied.

Also, because the manufacturing method of the semiconductor device of the present embodiment can improve the production efficiency as described above, the manufacturing cost can be reduced.

Further, in assembling the semiconductor device of the present embodiment, because the NCF 10 is prefabricated, the coupling section of the flip chip coupling is covered by a resin (NCF 10) from the initial stage. Thus, the thermal stress applied to the coupling section described above can be reduced. As a result, generation of the crack in the coupling section described above can be reduced, and coupling reliability of the semiconductor device (BGA 5) can be improved.

[Modification]

Figure 14:
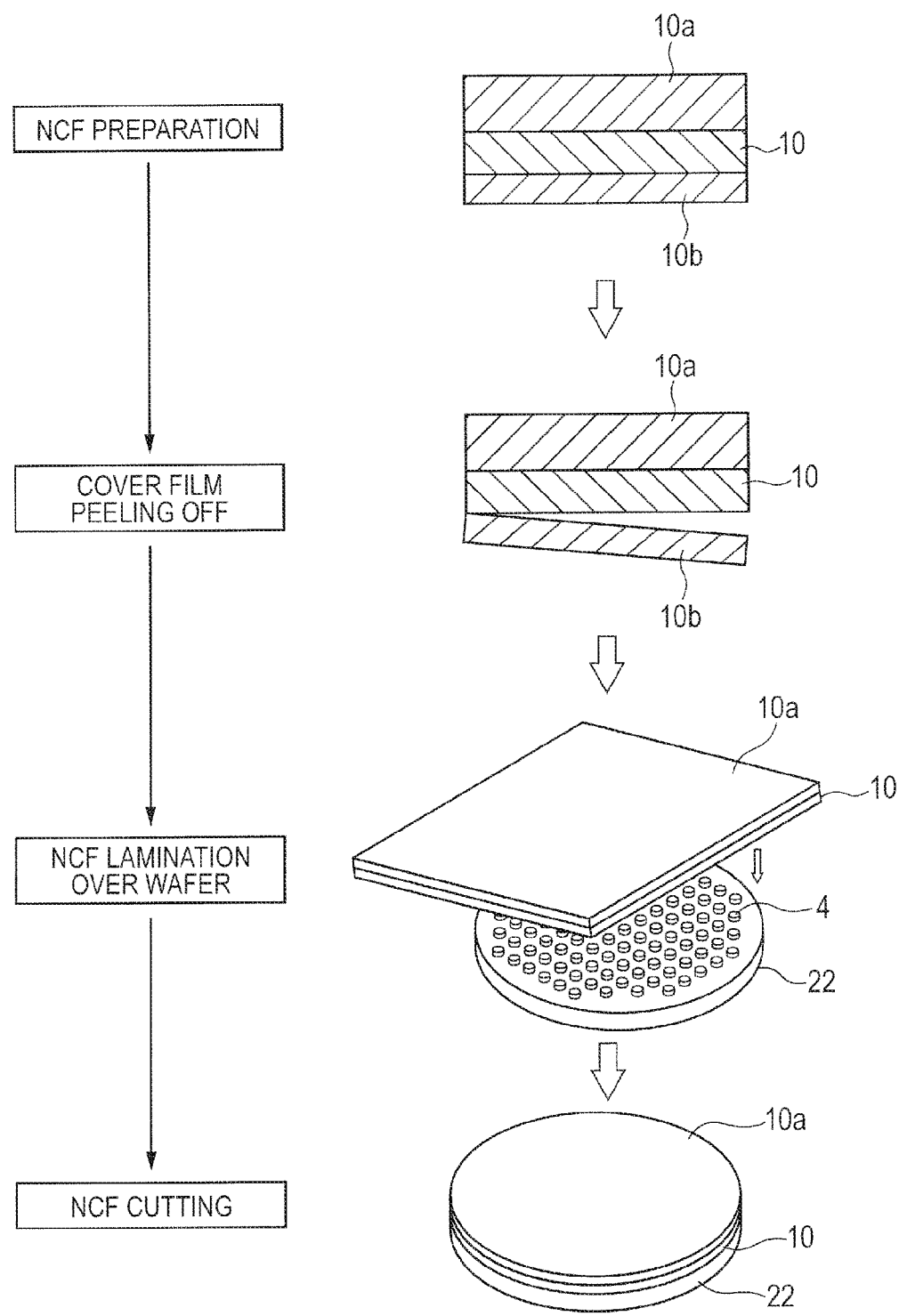
FIG. 14 is a cross-sectional view and a perspective view showing a first modification in an NCF feeding method of the embodiment.
Figure 15:
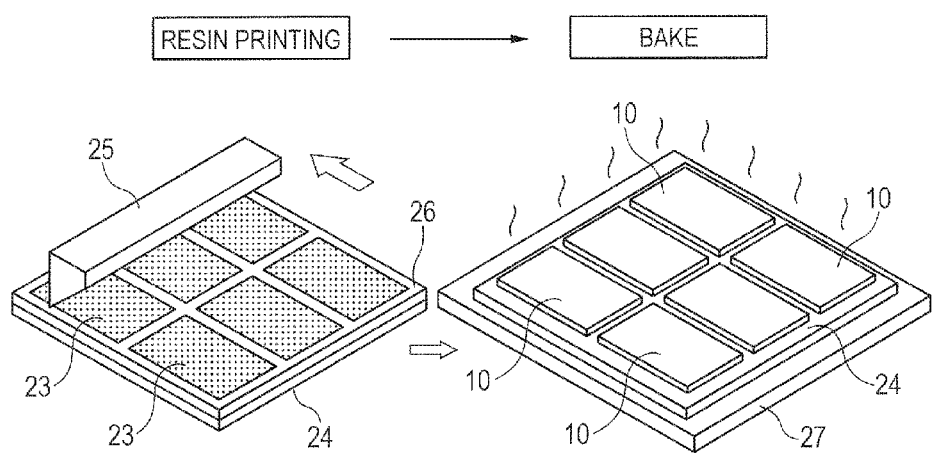
FIG. 15 is a perspective view showing a second modification in an NCF feeding method of the embodiment.
Figure 16:
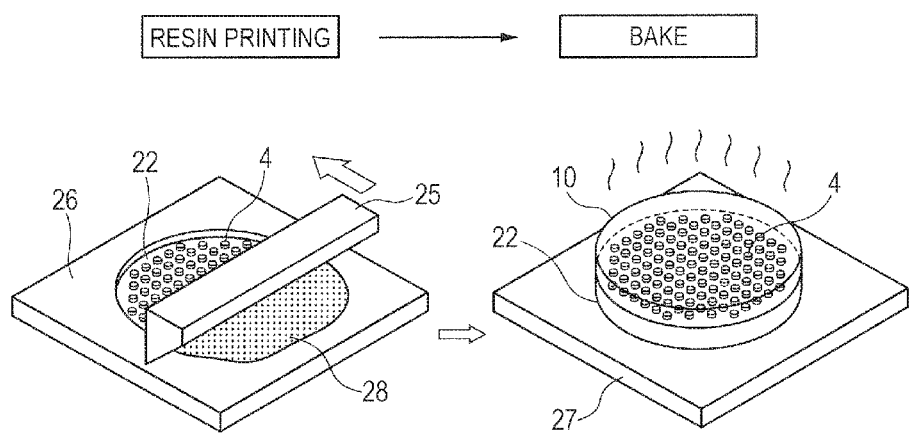
FIG. 16 is a perspective view showing a third modification in an NCF feeding method of the embodiment.

FIG. 14 is a cross-sectional view and a perspective view showing a first modification in an NCF feeding method of the embodiment, FIG. 15 is a perspective view showing a second modification in an NCF feeding method of the embodiment, and FIG. 16 is a perspective view showing a third modification in an NCF feeding method of the embodiment.

The first-third modifications are for explaining the method for forming the NCF 10 in the substrate.

The first modification shown in FIG. 14 shows a method for feeding the NCF 10 over a film to a wafer (chip, substrate) 22 side.

First, NCF preparation is executed. Here, such the NCF 10 is prepared that the NCF 10 is attached to a base film 10a and a cover film 10b is attached over the top thereof. Next, in cover film peeling off, the cover film 10b is peeled off from the NCF 10. Thereafter, NCF lamination over wafer is executed. For example, between the dicing steps, the NCF 10 cut (NCF cutting) to a size same to that of the wafer 22 is laminated over the circuit surface of the wafer 22.

The thickness and the attaching condition of the NCF 10 at this time are similar to the conditions described in the embodiment. Also, in the wafer dicing step, the NCF 10 and the semiconductor chip are cut simultaneously into individual chips. Thereafter, the semiconductor chips attached with the NCF are picked up from the dicing sheet, and are mounted over the Si interposer and the printed wiring substrate.

According to the NCF forming method shown in FIG. 14, by executing NCF attaching in a wafer level, the number of pieces of the semiconductor chip to which the NCF 10 can be fed in the laminating work of one time can be increased.

Next, the second modification shown in FIG. 15 will be explained.

The second modification is a method for forming the NCF 10 by printing liquid resins 23 over a multiple patterning substrate 24 by a squeegee 25 and attaining a B stage.

First, in resin printing, the liquid resins 23 are printed by the squeegee 25 over the multiple patterning substrate 24 where a mask 26 for printing is disposed. Thereafter, in bake, the multiple patterning substrate 24 disposed over a stage 27 is subjected to a bake treatment, and is made to be a B stage. Thus, the plural NCFs 10 are formed over the multiple patterning substrate 24.

According to the NCF forming method shown in FIG. 15, the NCFs 10 can be formed efficiently over the multiple patterning substrate 24 by forming the NCFs 10 over the multiple patterning substrate 24 by the printing method because the production efficiency of the printing method is high. Also, because the NCF 10 can be fed selecting the location according to the design of the mask 26 for printing, the use efficiency of the material also can be improved.

Next, the third modification shown in FIG. 16 will be explained.

The third modification is a method for forming the NCF 10 by printing paste-like resins 28 over the wafer 22 (may be a chip or a printed wiring substrate).

First, in resin printing, the paste-like resins 28 are printed over the wafer (or a printed wiring substrate) 22 before dicing using the mask 26 for printing and the squeegee 25. Thereafter, in bake, the wafer 22 is subjected to a bake treatment over the stage 27, and the paste-like resins 28 are made to be a B stage. Thus, the NCFs 10 are formed over the wafer 22.

According to the NCF forming method shown in FIG. 16, the NCFs 10 can be formed efficiently over the wafer 22 by forming the NCFs 10 over the wafer 22 by the printing method because the production efficiency of the printing method is high.

Also, similarly to the above, because the NCF can be fed selecting the location according to the design of the mask 26 for printing, the use efficiency of the material also can be improved.

Figure 17:
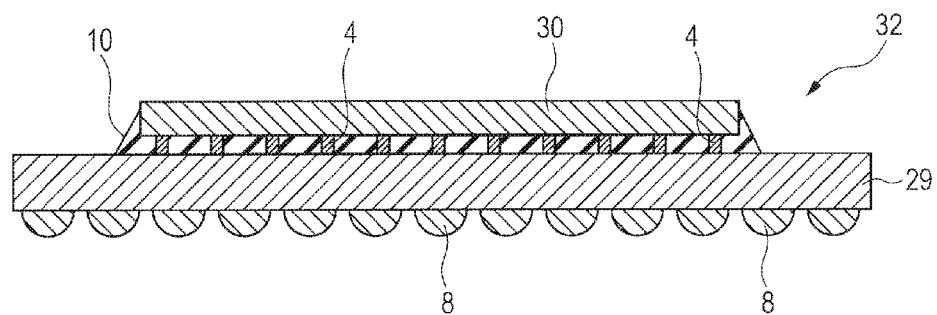
FIG. 17 is a cross-sectional view showing a structure of a semiconductor device of a fourth modification of the embodiment.
Figure 18:
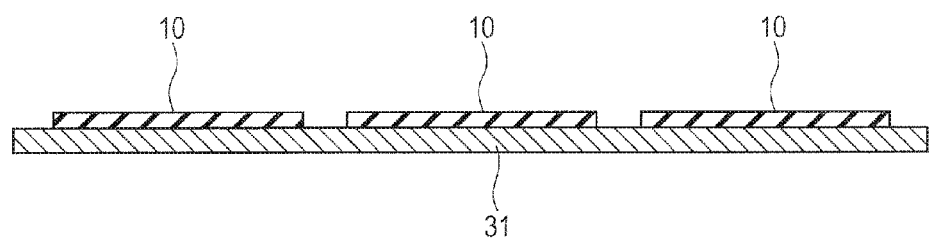
FIG. 18 is a cross-sectional view showing an NCF feeding method in assembling the semiconductor device shown in FIG. 17.
Figure 19:
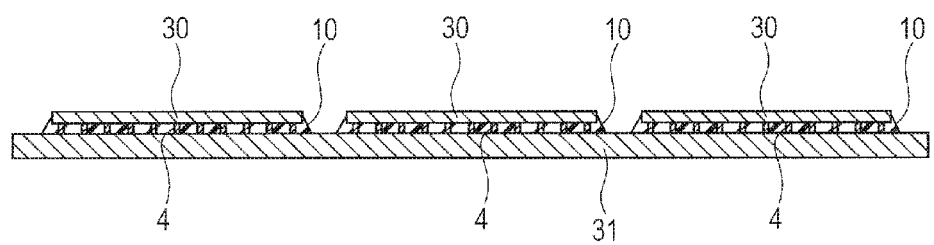
FIG. 19 is a cross-sectional view showing a flip chip coupling state in assembling the semiconductor device shown in FIG. 17.
Figure 20:
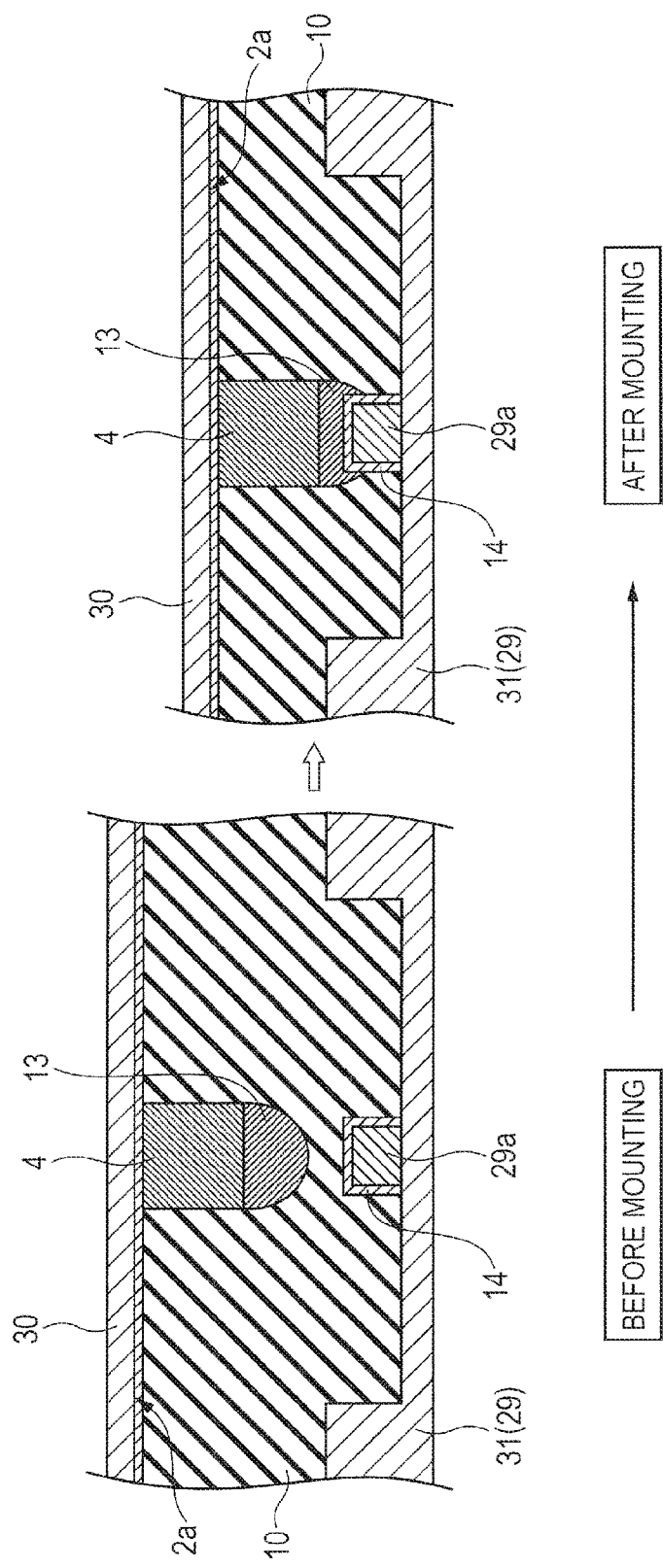
FIG. 20 is an enlarged partial cross-sectional view showing a structure before coupling and after coupling at the time of flip chip coupling shown in FIG. 19.

FIG. 17 is a cross-sectional view showing a structure of a semiconductor device of a fourth modification of the embodiment, FIG. 18 is a cross-sectional view showing the NCF feeding method in assembling the semiconductor device shown in FIG. 17, FIG. 19 is a cross-sectional view showing a flip chip coupling state in assembling the semiconductor device shown in FIG. 17, and FIG. 20 is an enlarged partial cross-sectional view showing a structure of before coupling and after coupling at the time of flip chip coupling shown in FIG. 19.

The fourth modification shown in FIG. 17 is a BGA (semiconductor device) 32 in which a silicon chip (semiconductor chip) 30 is mounted over a printed wiring substrate 29 that is a chip support substrate by flip chip coupling, and the NCF 10 disposed by the prefabricating method is filled between the printed wiring substrate 29 and the silicon chip 30.

Also, on the upper surface side of the printed wiring substrate 29, the silicon chip 30 is flip-chip-coupled through the plural columnar Cu pillars 4 that are the columnar bump electrodes, whereas on the lower surface side, the plural BGA balls 8 are arranged which are the terminals for external coupling of the BGA 32.

Next, assembling of the BGA 32 will he explained.

Also, in assembling of the BGA 32, a case of assembling using a multiple patterning substrate 31 that is a matrix substrate will be explained.

First, the surface of the multiple patterning substrate 31 shown in FIG. 18 is plasma-cleaned. The plasma-cleaning here is same with the Ar plasma-cleaning shown in Step S8 of FIG. 2 of the embodiment. In other words, the surface of the multiple patterning substrate 31 where the NCF 10 will he disposed in the step to follow is plasma-cleaned. Thus, the impurities and stains of the surface (particularly the upper surface) of the multiple patterning substrate 31 can be removed.

After the plasma-cleaning, as shown in FIG. 18, the NCFs 10 are disposed over the chip mounting section of the upper surface of the multiple patterning substrate 31. Also, with respect to disposal of the NCF 10, the work of the motions of punching the NCF 10 by a punch and mounting the NCF 10 is repeated until the disposal of the NCF 10 finishes with respect to all chip mounting sections of the multiple patterning substrate 31.

After disposing the NCFs, as shown in FIG. 19, the silicon chips 30 are mounted from the top through the NCFs 10.

At this time, as shown in "before mounting" of FIG. 20, the Cu pillar 4 of the silicon chip 30 and an electrode 29a of the printed wiring substrate 29 are positioned with each other, a load is thereafter applied to the silicon chip 30, and the silicon chip 30 is pushed in to the printed wiring substrate 29 side.

Also, the columnar Cu pillar 4 formed on the chip side and the electrode 29a on the printed wiring substrate 29 side are made to contact each other, and as shown in "after mounting" of FIG. 20, the solder 13 at the distal end of the columnar Cu pillar 4 formed on the chip side is deformed.

At this time, because the Au plating 14 is formed over the surface of the electrode 29a, by denting of the electrode 29a into the solder 13, the solder 13 and the Au plating 14 of the surface of the electrode 29a become a contact state.

Also, when chip mounting shown in FIG. 20 is to be executed, each of the solders 13 is heated at a temperature lower than the melting point of the solder 13 that is coated at the distal end of each of the plural Cu pillars 4, and each of the plural electrodes 29a is made to dent into each of the solders 13 (the solder 13 is deformed).

Further, as a motion of chip mounting in the multiple patterning substrate 31, the mounting motion is repeated over one multiple patterning substrate 31, and the chip mounting to predetermined locations (chip mounting sections) of the multiple patterning substrate 31 is executed.

After the chip mounting, by executing reflow in a state the Au plating 14 contacts the solder 13, the solder 13 melts, and the solder 13 and the Au plating 14 are electrically coupled with each other. In other words, the Cu pillar 4 on the chip side and the electrode 29a on the substrate side are electrically coupled with each other, and flip chip coupling is completed.

As described above, also in assembling of the BGA 32 in which flip chip coupling is executed to the printed wiring substrate 29, by plasma-cleaning the surface of the multiple patterning substrate 31 before attaching the NCF 10 to the multiple patterning substrate 31 (printed wiring substrate 29), the impurities and the like attached to the surface (upper surface) of the multiple patterning substrate 31 can be removed.

Thus, the adhesiveness between the surface of the multiple patterning substrate 31 (printed wiring substrate 29) and the NCF 10 can be improved.

As a result, the multiple patterning substrate 31 (printed wiring substrate 29) and the NCF 10 comes to be hardly peeled off from each other, and the quality and reliability of the BGA 32 can be improved.

Also, because other assembling methods and other effects of the BGA 32 are similar to the assembling method and effect of the BGA 5 of the embodiment, duplicated explanation thereof will be omitted.

Although the invention achieved by the present inventors has been explained above specifically based on the embodiment, it is needless to mention that the present invention is not limited to the embodiment described so far and various alterations are possible within a scope not deviating from the purposes thereof.

For example, although a case of assembling the BGA 32 using the multiple patterning substrate (matrix substrate) 31 was explained in the fourth modification described above, assembling may be executed using not the multiple patterning substrate 31 but an individual substrate that has been fragmented beforehand.

Also, a case the interposer (second substrate) was the Si interposer formed of Si (silicon) was explained in the embodiment described above, the interposer may be a glass imposer with the main composition of a glass material, an organic interposer with the main composition of an organic material, and so on, for example.

The core material of the glass imposer is a glass material, and the effect that even a high frequency is not attenuated much can be secured because the glass material has a high insulation property. Also, the cost of the glass interposer is lower than that of the Si interposer, and the substrate cost can be reduced by employing the glass interposer.

Further, the organic interposer can make line/space of the wiring 5 µm/5 µm or less, for example, and can increase the wiring density compared to the printed wiring substrates of related arts. Also, the cost of the organic interposer is lower than that of the Si interposer and the glass interposer, and the substrate cost can be reduced further by employing the organic interposer.

What is claimed is:

1. A method for manufacturing a semiconductor device, comprising the steps of:
   before the step (a), baking the chip support substrate;
   (a) plasma-cleaning an upper surface of the chip support substrate that includes the upper surface where a plurality of electrodes are formed and a lower surface on the opposite side of the upper surface;
   (b) after the step (a), disposing an insulative adhesive over the upper surface of the chip support substrate;
   between the step (b) and the step (c), baking the insulative adhesive;
   (c) after the step (b), mounting a semiconductor chip on the upper surface of the chip support substrate through the insulative adhesive; and
   (d) after the step (c), heating the chip support substrate mounted with the semiconductor chip and the insulative adhesive by reflow, and electrically coupling each of the electrodes of the chip support substrate and each of a plurality of electrode pads of the semiconductor chip with each other through a plurality of bump electrodes,
   wherein, in the step (d), each of the electrodes and each of the electrode pads are electrically coupled with each other through the bump electrodes in a state the insulative adhesive is disposed around each of the bump electrodes, and
   wherein, in the step of baking the insulative adhesive, the insulative adhesive is baked at a temperature lower than a bake temperature of the chip support substrate in the step of baking the chip support substrate.

2. The method for manufacturing a semiconductor device according to claim 1,
   wherein, in the step of baking the insulative adhesive, the insulative adhesive is baked within a time shorter than a bake time of the chip support substrate in the step of baking the chip support substrate.

3. The method for manufacturing a semiconductor device according to claim 1,
   wherein, in the step (c), the semiconductor chip and the chip support substrate are positioned with each other recognizing marks formed outside the insulative adhesive of the upper surface of the chip support substrate.

4. The method for manufacturing a semiconductor device according to claim 1,
   wherein, in the step (c), after positioning the semiconductor chip and the chip support substrate with each other, solder coated at each distal end of the bump electrodes is heated and deformed at a temperature lower than the melting point of the solder, and each of the electrodes is dented into the respective solder.

5. The method for manufacturing a semiconductor device according to claim 4,
   wherein Au plating is formed over the surface of each of the electrodes of the chip support substrate, and the Au plating and the solder are coupled with each other.

6. A method for manufacturing a semiconductor device, comprising the steps of:
   (a) mounting a second substrate over a first substrate with the second substrate including an upper surface where a plurality of electrodes are formed and a lower surface on the opposite side of the upper surface;
   (b) after the step (a), baking the first substrate;
   (c) after the step (b), plasma-cleaning the upper surface of the second substrate;
   (d) after the step (c), disposing an insulative adhesive over the upper surface of the second substrate;
   between the step (d) and the step (e), baking the insulative adhesive;
   (e) after the step (d), mounting a semiconductor chip over the upper surface of the second substrate through the insulative adhesive; and
   (f) after the step (e), heating the second substrate mounted with the semiconductor chip and the insulative adhesive by reflow, and electrically coupling each of the electrodes of the second substrate and each of a plurality of electrode pads of the semiconductor chip with each other through a plurality of bump electrodes,
   wherein in the step (f), each of the electrodes and each of the electrode pads are electrically coupled with each other through the bump electrodes in a state the insulative adhesive is disposed around each of the bump electrodes, and
   wherein, in the step of baking the insulative adhesive, the insulative adhesive is baked at a temperature lower than a bake temperature of the first substrate in the step (b).

7. The method for manufacturing a semiconductor device according to claim 6,
   wherein, in the step of baking the insulative adhesive, the insulative adhesive is baked within a time shorter than a bake time of the first substrate in the step (b).

8. The method for manufacturing a semiconductor device according to claim 6,
   wherein, in the step (e), the semiconductor chip and the second substrate are positioned with each other recognizing marks formed outside the insulative adhesive of the upper surface of the second substrate.

9. The method for manufacturing a semiconductor device according to claim 6,
   wherein, in the step (e), after positioning the semiconductor chip and the second substrate with each other, solder coated at each distal end of the bump electrodes is heated and deformed at a temperature lower than the melting point of the solder, and each of the electrodes is dented into the respective solder.

10. The method for manufacturing a semiconductor device according to claim 9,
    wherein Au plating is formed over the surface of each of the electrodes of the second substrate, and the Au plating and the solder are coupled with each other.

11. The method for manufacturing a semiconductor device according to claim 6, wherein, in the step (e), the semiconductor chip is absorbed and held by an absorbing surface of a head of a flip chip bonder, and the semiconductor chip is mounted on the upper surface of the second substrate, and wherein the plane size of the absorbing surface of the head is equal to or smaller than the plane size of the semiconductor chip.

12. The method for manufacturing a semiconductor device according to claim 6, wherein the second substrate is a substrate formed of silicon, and wherein each of the bump electrodes is a columnar electrode formed of an alloy with the main composition of Cu.

13. The method for manufacturing a semiconductor device according to claim 6, wherein the plasm-cleaning in the step (c) is executed by generating plasma by argon gas or oxygen.

* * * * *